United States Patent
Hirose et al.

(10) Patent No.: US 8,330,499 B2
(45) Date of Patent: Dec. 11, 2012

(54) COMPARATOR CIRCUIT PROVIDED WITH DIFFERENTIAL AMPLIFIER MAKING LOGICAL JUDGMENT BY COMPARING INPUT VOLTAGE WITH REFERENCE VOLTAGE

(75) Inventors: Tetsuya Hirose, Kobe (JP); Keishi Tsubaki, Kobe (JP); Masahiro Numa, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 117 days.

(21) Appl. No.: 13/036,405

(22) Filed: Feb. 28, 2011

(65) Prior Publication Data

US 2011/0210762 A1     Sep. 1, 2011

(30) Foreign Application Priority Data

Mar. 1, 2010   (JP) .................... 2010-044369

(51) Int. Cl.
*H03K 5/22*   (2006.01)

(52) U.S. Cl. ......................................... 327/65; 327/89

(58) Field of Classification Search ............... 327/63–67, 327/89
See application file for complete search history.

(56) References Cited

U.S. PATENT DOCUMENTS

| | | | | |
|---|---|---|---|---|
| 5,587,674 A | * | 12/1996 | Danstrom | ........................ 327/67 |
| 6,922,319 B2 | | 7/2005 | Akita | |
| 2003/0025533 A1 | | 2/2003 | Akita et al. | |
| 2003/0184927 A1 | | 10/2003 | Akita | |
| 2005/0017761 A1 | | 1/2005 | Akita et al. | |

FOREIGN PATENT DOCUMENTS

| | | | |
|---|---|---|---|
| JP | 2002217691 A | * | 8/2002 |
| JP | 2002-311063 | | 10/2002 |
| JP | 2003-8369 | | 1/2003 |
| JP | 2004-64620 | | 2/2004 |
| JP | 2009-194600 | | 8/2009 |

OTHER PUBLICATIONS

Toyoaki Kito et al., "Current reference circuit by using temperature characteristics of carrier mobility", Proceedings of the IEICE (The Institute of Electronics, Information and Communication Engineers) General Conference 2009, A-1-40, p. 40, Mar. 2009 (along with partial English translation).
Nano Power Solutions, Inc., "Nano Power CMOS Comparator Circuit, NPS1101", Product Information, [Searched on Feb. 15, 2010], Internet <URL: http://www.npsi.jp/j/product/nps1101.pdf>, pp. 1-10 (along with partial English translation).
Nano Power Solutions, Inc., "Nano Power CMOS Comparator Circuit, NPS1102", Product Information, [Searched on Feb. 15, 2010], Internet <URL: http://www.npsi.jp/j/product/nps1102.pdf>, pp. 1-10 (along with partial English translation).

* cited by examiner

*Primary Examiner* — Quan Tra
(74) *Attorney, Agent, or Firm* — Wenderoth, Lind & Ponack, L.L.P.

(57) ABSTRACT

In a comparator circuit having a differential amplifier, which makes a logical judgment by comparing an input voltage with a reference voltage, generates and outputs a resulting output voltage thereof, a current source generates and supplies a bias current of a predetermined minute current to the differential amplifier, and a first inverter circuit inverts a differential voltage from the differential amplifier. An adaptive bias current generator circuit detects the bias current of the current source, and a through current of the first inverter circuit. The adaptive bias current generator circuit generates and supplies an adaptive bias current for executing adaptive bias current control to the differential amplifier to allow the differential amplifier to operate with the bias current upon no logical judgment, and to allow the differential amplifier to operate by using the adaptive bias current obtained by increasing the bias current upon logical judgment.

17 Claims, 27 Drawing Sheets

Fig.23

| CIRCUIT CONFIGURATION | ESTIMATED CIRCUIT CONFIGURATION AND ITS DESCRIPTION |
| --- | --- |
| | DESCRIPTION |
| 2-STAGE | BASIC AMPLIFIER + SOURCE-GROUNDED AMPLIFIER (PRIOR ART OF FIG. 2) |
| NPS | COMPARATOR PROPOSED BY NPS INC. (PRIOR ART OF FIG. 5) |
| BULK | BODY BIAS EFFECT IS UTILIZED IN IMPROVED VERSION OF NPS INC. (FIRST PREFERRED EMBODIMENT OF FIG. 7) |
| INV | COMPARATOR UTILIZING BREAKTHROUGH CURRENT OF CMOS INVERTER (SECOND PREFERRED EMBODIMENT OF FIG. 9) |
| INV+ | BIASING METHOD IS SEPARATED IN COMPARATOR UTILIZING BREAKTHROUGH CURRENT OF CMOS INVERTER (THIRD PREFERRED EMBODIMENT OF FIG. 11) |
| WR-INV+ | WIDE-RANGE DIFFERENTIAL AMPLIFIER IS UTILIZED IN COMPARATOR UTILIZING BREAKTHROUGH CURRENT OF CMOS INVERTER (FOURTH PREFERRED EMBODIMENT OF FIG. 13) |

Fig.24

ESTIMATION RESULTS OF DELAY TIME

| CIRCUIT CONFIGURATION | 2-STAGE | NPS | BULK | INV | INV+ | WR-INV+ |
|---|---|---|---|---|---|---|
| TRIANGULAR WAVE SIGNAL ANALYSIS (INPUT OF TRIANGULAR WAVE OF 500 Hz) | | | | | | |
| PROPAGATION DELAY (L→H) (μsec) | 172 (159~190) | 1.5 (-2.6~8.1) | 1.4 (-4.3~8.6) | 2.6 (-16~18) | 5.1 (1.2~9.8) | 7 (1.8~12) |
| PROPAGATION DELAY (H→L) (μsec) | 9.7 (4.5~14) | 0.89 (-4.2~4.8) | 0.91 (-6.4~6.5) | 3 (-14~28) | 6.2 (-0.34~10.3) | 9.6 (3~16) |
| RECTANGULAR PULSE SIGNAL ANALYSIS (INPUT OF RECTANGULAR PULSE OF 500 Hz) | | | | | | |
| PROPAGATION DELAY (L→H) (μsec) | 163 (150~180) | 203 (172~246) | 97 (68~134) | 6.2 (4~53) | 17 (10~24) | 25 (17~34) |
| PROPAGATION DELAY (H→L) (μsec) | 6.2 (5.6~8.9) | 3.3 (2.1~4) | 2.1 (1.9~2.9) | 0.073 (0.050~0.120) | 0.022 (0.02~0.03) | 8.7 (7.7~10) |

COMPARATOR CIRCUIT PROVIDED WITH DIFFERENTIAL AMPLIFIER MAKING LOGICAL JUDGMENT BY COMPARING INPUT VOLTAGE WITH REFERENCE VOLTAGE

BACKGROUND OF THE INVENTION

1. Field of the Invention

The present invention is related to a comparator circuit, which is a fundamental component circuit of the integrated circuit technology, and is related, in particular, to a circuit technology to achieve power reduction of the comparator circuit.

2. Description of the Related Art

A variety of electronic equipments around us are currently configured to include semiconductor integrated circuits. Power reductions of the semiconductor integrated circuits have been achieved by scale shrinkage of device components and power supply voltage reduction. However, it is estimated that the device scale shrinkage approaches its limit, and a low-power consumption design technology making good use of circuit technologies is indispensable in order to achieve a further power reduction.

The comparator circuit is one of the most fundamental component circuits among electronic circuits. FIG. 1 shows a circuit symbol diagram of a comparator circuit. The comparator circuit has an input voltage terminal T1, a reference voltage terminal T2 and an output voltage terminal T3, compares an input voltage $V_{IN}$ with a reference voltage $V_{REF}$, and outputs a logical value corresponding to it. That is, a logical value of "0" or "1" is outputted depending on whether the input voltage $V_{IN}$ is larger or smaller than the reference voltage $V_{REF}$. There is an analog-to-digital converter to convert an analog signal into a digital signal as an application example. In a majority of analog-to-digital converters, the performance of the comparator circuit has a decisive influence on the total performance. Besides this, comparator circuits are used in a variety of application circuits such as digital-to-analog converters, oscillators, voltage detectors, zero-cross detectors, peak voltage detectors and full-wave rectifiers. Comparator circuits, which are often used by a large number of analog digital mixed signal LSI technologies, are fundamental component circuits for which the power consumption reduction is earnestly demanded.

FIG. 2 is a circuit diagram showing a configuration of a 2-stage comparator circuit according to a first prior art. The comparator circuit is configured to include the following:

(a) a gate bias voltage generator circuit 11, which is configured to include a bias current source 11A having a current $I_{REF}$ and a p-channel MOSFET (p-channel MOSFET is hereinafter referred to as pMOSFET) Q11;

(b) a differential amplifier 12, which is configured to include three pMOSFETs Q21 to Q23 and two n-channel MOSFETs (n-channel MOSFET is hereinafter referred to as nMOSFET) Q24 to Q25; and (c) a source-grounded amplifier 13, which is configured to include a pMOSFET Q31 and an nMOSFET Q32.

The differential amplifier compares two input signals, i.e., the input voltage $V_{IN}$ and the reference voltage $V_{REF}$ with each other. Since a tail current $I_{TAIL}$ totally flows through the MOSFET Q23 on the input voltage $V_{IN}$ side when the input voltage $V_{IN}$ is lower than the reference voltage $V_{REF}$, an output voltage $V_O$ of the differential amplifier 12 is indicative of high level. Conversely, since the tail current $V_{TAIL}$ flowing through the MOSFET Q21 totally flows through the MOSFETs Q22 and Q24 on the reference voltage $V_{REF}$ side when the input voltage $V_{IN}$ is higher than the reference voltage $V_{REF}$, the output voltage $V_O$ of the differential amplifier 12 is indicative of low level. Since the drain voltage of the MOSFET Q21 through which the tail current $I_{TAIL}$ flows has a finite voltage value, the high level of the output voltage of the differential amplifier does not make a full swing from a ground potential to a power supply voltage $V_{DD}$. Moreover, since the voltage gain of the simple differential amplifier 12 is often insufficient, the source-grounded amplifier 13 of the subsequent stage is utilized. With this arrangement, the output voltage $V_{OUT}$ exhibits a characteristic that makes a steep full swing. Therefore, in the 2-stage comparator circuit of FIG. 2, the output voltage $V_{OUT}$ is indicative of low level when the input voltage $V_{IN}$ is lower than the reference voltage $V_{REF}$, and the output voltage $V_{OUT}$ is indicative of high level when the input voltage $V_{IN}$ is higher than the reference voltage $V_{REF}$.

PRIOR ART DOCUMENTS

Patent Documents

Patent Document 1: Japanese patent laid-open publication No. JP 2002-311063 A; and Patent Document 2: Japanese patent laid-open publication No. JP 2003-008369 A.

Non-Patent Documents

Non-Patent Document 1: Toyoaki Kito, et al., "Current reference circuit by using temperature characteristics of carrier mobility", Proceedings of the IEICE (The Institute of Electronics, Information and Communication Engineers) General Conference 2009, A-1-40, p. 40, March, 2009;

Non-Patent Document 2: Nano Power Solutions, inc., "Nano Power CMOS Comparator Circuit, NPS1101", Product Information, [Searched on Feb. 15, 2010], Internet<URL: http://www.npsi.jp/j/product/nps1101.pdf>; and Non-Patent Document 3: Nano Power Solutions, inc., "Nano Power CMOS Comparator Circuit, NPS 1102", Product Information, [Searched on Feb. 15, 2010], Internet<URL: http://www.npsi.jp/j/product/nps1102.pdf>.

It is considered to operate a comparator circuit with an ultralow power. Considering the 2-stage comparator circuit of FIG. 2 taken as an example, a current flowing through the comparator circuit is determined by the bias current $I_{REF}$ of the bias current source 11A. That is, if the bias current $I_{REF}$ of the bias current source 11A is set to an ultralow current to an order of several nano-amperes, the ultralow power of the comparator circuit can be achieved (e.g., the current source circuit utilized in the Non-Patent Document 1 can be utilized for the generation of a minute current having an order of several nano-amperes). However, there is such a problem that the operating speed becomes very slow when the bias current $I_{REF}$ is designed to be a minute current having an order of nano-amperes. That is, since a circuit configuration based on a differential amplifier is used for the comparator circuit, power reduction can be achieved by designing the tail current of the differential amplifier at a low current. However, there has been such a problem that time necessary for logical judgment of the comparator circuit becomes long and the signal processing becomes difficult when the tail current is designed to be a minute current. This fact is described as follows.

FIG. 3 is a circuit diagram when parasitic capacitances $C_{L1}$ and $C_{L2}$ are taken into consideration in the 2-stage comparator circuit of FIG. 2. In FIG. 3, $C_{L1}$ denotes a parasitic capacitance of the output terminal of the differential amplifier 12, and $C_{L2}$ denotes a parasitic capacitance (including load capacitance) of the output terminal of the source-grounded amplifier 13. That is, these capacitances $C_{L1}$ and $C_{L2}$ exist in the output terminals (the output terminal of the differential amplifier 12 and the output terminal of the source-grounded amplifier 13) of the stages of the comparator circuit, and these factors need to be considered. Regarding the tail current $I_{TAIL}=I_{REF}$, the logical output is determined by charging and discharging these capacitances. Therefore, if the bias current is set to a minute current, then the speed of charging and discharging these capacitances, i.e., $C_{L1}/I_{REF}$ and $C_{L2}/I_{REF}$ become extremely large, and time having an order equal to or larger than several micro-seconds is required. Setting the bias current value $I_{REF}$ to an order of nano-amperes has had such a problem that the logical judgment time becomes long when the ultralow power operation can be achieved.

As described above, by setting the tail current $I_{TAIL}$ to an order of several nano-amperes as described above, the amount of current consumed by the comparator circuit can be largely reduced. However, on the other hand, there is such a problem that logical inversion time disadvantageously becomes extremely long. As a method for solving this problem, there is an adaptive bias current control technique. The idea of the technique and a diagram of the principle of operation are described as follows.

FIG. 4 is a circuit diagram showing a configuration of an adaptive control type comparator circuit using a speed-up technique with an adaptive bias current in the 2-stage comparator circuit of FIG. 2. The "adaptive bias current control" is a technique for improving the operating speed by performing minute current operation for a time interval when no logical judgment is made and increasing the tail current only for a time interval when logical judgment is made. Referring to FIG. 4, the adaptive control type comparator circuit is configured to include an adaptive bias current generator circuit 14 in addition to the conventional comparator circuit.

The adaptive bias current generator circuit 14 is provided for judging whether to make logical judgment. The adaptive bias current generator circuit 14 monitors the input voltage $V_{IN}$ and the reference voltage $V_{REF}$ in a manner similar to that of the conventional comparator circuit 10. When the values of the input voltage $V_{IN}$ and the reference voltage $V_{REF}$ are largely different from each other, i.e., when the main body of the conventional comparator circuit 10 makes no logical judgment, the adaptive bias current generator circuit 14 does neither operate nor generate an adaptive bias current $I_{ADP}$. Therefore, the comparator circuit 10 operates with the tail current $I_{REF}$ intact. When the values of the input voltage $V_{IN}$ and the reference voltage $V_{REF}$ approach each other, i.e., when the main body of the conventional comparator circuit 10 makes logical judgment, the adaptive bias current generator circuit 14 operates to generate an adaptive bias current $I_{ADP}$. The adaptive bias current $I_{ADP}$ is added to the reference current $I_{REF}$, and the tail current $I_{TAIL}$ becomes $I_{REF}+I_{ADP}$. As a result, the amount of current at the time of logical judgment increases by the adaptive bias current $I_{ADP}$, and the time required for the logical judgment can be reduced. Normally, the adaptive bias current $I_{ADP}$ can be designed to be an order of several tens to several hundreds of micro-amperes, and therefore, an order of the tail current $I_{TAIL}$ for the time interval becomes a larger current. The operating speed at the time of logical judgment is expressed by the following equations.

$$C_{L1}/(I_{REF}+I_{ADP}) \approx C_{L1}/I_{ADP} \quad (1)$$

$$C_{L2}/(I_{REF}+I_{ADP}) \approx C_{L2}/I_{ADP} \quad (2)$$

Therefore, the amount of current required for the charging and discharging of the parasitic capacitance shifts from the bias current value $I_{REF}$ to the adaptive bias current $I_{ADP}$ ($\gg I_{REF}$), and a remarkable improvement in the operating speed can be achieved.

The adaptive bias current control technique can be generalized as follows. The adaptive bias current control technique is the technique of achieving ultralow power operation by operating the comparator circuit with the bias current $I_{REF}$ when no logical judgment operation is performed in the standby stage, and swiftly ending the logical judgment by operation with the adaptive bias current $I_{ADP}$ when the logical judgment operation is performed.

FIG. 5 is a circuit diagram showing a configuration of the comparator circuit of the second prior art using the adaptive bias current control technique, which has been proposed by Nano Power Solutions, Inc. (hereinafter, referred to as NPS Inc.) (See, for example, the Non-Patent Documents 2 and 3). The adaptive bias current generator circuit 14 is configured to include the following:

(1) a differential amplifier 14a, which is configured to include pMOSFETs Q41 to Q43 and nMOSFETs Q44 and Q45; and (2) a differential amplifier 14b, which is configured to include pMOSFETs Q46 to Q48 and nMOSFETs Q49 and Q50.

These differential amplifiers 14a and 14b monitor the input voltage $V_{IN}$ and the reference voltage $V_{REF}$ in a manner similar to that of the main body of the comparator circuit 10. In this case, the two differential amplifiers 14a and 14b monitor the input voltage $V_{IN}$ and the reference voltage $V_{REF}$ with the polarities mutually exchanged. It is noted that a circuit 15 configured to include the MOSFETs Q51 and Q52 is a well-known push-pull type bias control circuit, which detects the operating current of the differential amplifier 12 (concretely, the current of the MOSFET Q24) and controls the bias voltage of the MOSFET Q31 of the source-grounded amplifier 13 according to the detected result.

Next, the operation of the comparator circuit of FIG. 5 is described as follows with reference to FIG. 6. FIGS. 6A and 6B are graphs showing an operating mechanism of the adaptive bias current control of the comparator circuit of FIG. 5 and representing a relation between the input voltage $V_{IN}$ and the output voltage $V_{OUT}$ indicating that the output voltage curves of two differential amplifiers intersect with each other. FIG. 6A is a characteristic curve in a case where the two differential amplifiers have an identical characteristic. It is a graph indicating an existence of a region where both the two curves have finite voltage values in the vicinity of the reference voltage $V_{REF}$. FIG. 6B is a characteristic curve when the characteristics of the two differential amplifiers are each changed. It is a graph indicating the existence of the region where both the two curves have finite voltage values in the vicinity of the reference voltage $V_{REF}$ and the region is further increased than that of FIG. 6A.

That is, FIG. 6A shows output characteristics of the differential amplifiers 14a and 14b, where the output voltages of two differential amplifiers 14a and 14b have low level and high level, respectively, when the input voltage $V_{IN}$ is lower than the reference voltage $V_{REF}$. When the input voltage $V_{IN}$ becomes higher than the reference voltage $V_{REF}$, the output voltages of the two differential amplifiers 14a and 14b make transitions from low level to high level and from high level to low level, respectively. At this time, the output voltages of the two differential amplifiers 14a and 14b have a time interval when they have high voltages during the transitional interval in the vicinity of $V_{IN}=V_{REF}$. In the adaptive control type comparator circuit of FIG. 5, the output voltages of the two differential amplifiers 14a and 14b are monitored by two MOSFETs Q12 and Q13 connected in series to generate the adaptive bias current $I_{ADP}$.

Further, the adaptive control type comparator circuit of NPS Inc. has a built-in mechanism to generate a larger output current by charging the transitional timing of the output voltages of the differential amplifiers 14a and 14b. That is, the adaptive bias current $I_{ADP}$ can be controlled by intentionally generating offset voltages in the two differential amplifiers 14a and 14b. The offset voltages are generated by providing differences in the size of the input MOSFET pair (Q42 to Q43, Q47 to Q48) and the current mirror circuits (Q44 to Q45, Q49 to Q50) that constitute the differential amplifiers 14a and 14b. With this arrangement, the logical inversion points of the differential amplifiers 14a and 14b used in the adaptive bias current generator circuit 14 can be shifted. FIG. 6B shows this behavior. The differential amplifier 14a, which makes a transition from low level to high level, have a transition at a lower voltage, and the differential amplifier 14b, which makes a transition from high level to low level, have the transition at a higher voltage. By this operation, the MOSFET to generate the adaptive bias current becomes able to receive a larger high-level voltage and to generate a larger adaptive bias current $I_{ADP}$ than that of the prior art.

As described above, the existing adaptive bias current control circuit proposed by NPS Inc. has been achieved by changing the sizes of the transistors that constitute the current mirror circuit for the purpose of generating the offset voltage as described above. Therefore, the generated offset voltage has been small in a minute current region, and this has led to difficulties upon designing a larger adaptive bias current than that of prior art. Moreover, there has been such a problem that the circuit scale is relatively large since two differential amplifiers are used.

SUMMARY OF THE INVENTION

An object of the present invention is to solve the aforementioned problems and provide a comparator circuit capable of reducing the logical judgment time for signal processing with achieving low power consumption operation.

Moreover, it is another object of the invention to provide a comparator circuit capable of reducing the circuit scale and generating a larger adaptive bias current by efficiently generating the voltage offset voltage.

In order to achieve the aforementioned objective, according to one aspect of the present invention, there is provided a comparator circuit having a differential amplifier, and the comparator circuit makes a logical judgment by comparing an input voltage with a reference voltage, generates and outputs an output voltage of a result of the logical judgment. The comparator circuit includes a current source, a first inverter circuit, and an adaptive bias current generator. The current source generates and supplies a bias current of a predetermined minute current to the differential amplifier, and the first inverter circuit inverts a differential voltage from the differential amplifier and outputs an inverted signal. The adaptive bias current generator circuit detects the bias current of the current source, and detects a through current of the first inverter circuit. The adaptive bias current generator circuit generates and supplies an adaptive bias current for executing adaptive bias current control to the differential amplifier, based on the detected bias current and the detected through current, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier.

In the above-mentioned comparator circuit, the adaptive bias current generator circuit separately detects the bias current of the current source and the through current of the first inverter circuit.

In addition, in the above-mentioned comparator circuit, the adaptive bias current generator circuit detects the bias current of the current source, and generates the adaptive bias current by adding the detected bias current to the through current of the first inverter circuit.

Further, in the above-mentioned comparator circuit, the adaptive bias current generator circuit detects the through current of the first inverter circuit, and generates the adaptive bias current by adding the detected through current to the bias current of the current source.

Furthermore, the above-mentioned comparator circuit further includes a second inverter circuit, which inverts an output voltage from the first inverter circuit and outputs a resulting voltage.

Still further, the above-mentioned comparator circuit further includes a second inverter circuit, which inverts an output voltage from the differential amplifier and outputs a resulting voltage.

Still more further, in the above-mentioned comparator circuit, the differential amplifier is a wide-range differential amplifier that makes a full swing from a ground potential to a power supply voltage.

Still more further, in the above-mentioned comparator circuit, a diode-connection transistor is inserted in a power supply circuit of the wide-range differential amplifier.

According to another aspect of the present invention, there is provided a comparator circuit formed on a substrate, and the comparator circuit includes a first differential amplifier, a current source, and an adaptive bias current generator circuit. The first differential amplifier makes a logical judgment by comparing an input voltage with a reference voltage, generates and outputting an output voltage of a result of the logical judgment; and the current source generates and supplies a bias current of a predetermined minute current to the differential amplifier. The adaptive bias current generator circuit includes a second differential amplifier that generates an output voltage by comparing an input voltage with a reference voltage. The adaptive bias current generator circuit generates and supplies an adaptive bias current for executing adaptive bias current control to the differential amplifier, based on the input voltage and the reference voltage, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier, In this case, the second differential amplifier includes first and second differential pairs. The first differential pair includes a first transistor to which the input voltage is inputted and a second transistor to which the reference voltage is inputted, and the second differential pair includes a third transistor to which the input voltage is inputted and a fourth transistor to which the reference voltage is inputted. An output voltage of the second differential amplifier at a voltage where input-to-voltage characteristics of the two differential pairs intersect with each other is increased by connecting source electrodes of the first transistor and the fourth transistor to the substrate, and connecting substrates of the second transistor and the third transistor to a predetermined bias voltage.

In the above-mentioned comparator circuit, the bias voltage is a power supply voltage.

Therefore, according to the comparator circuit of the invention, the adaptive bias current generator circuit generates and supplies an adaptive bias current for executing adaptive bias current control to the differential amplifier, based on the detected bias current and the detected through current, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier. The adaptive bias current is increased by utilizing the through current of the inverter circuit or increasing the output voltage of the differential amplifier with the substrate or body potential changed, and this allows to provide the comparator circuit, which is able to remarkably reduce the logical judgment time for the signal processing and to operate at higher speed than that of the prior art with achieving lower power consumption operation.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 6A and 6B are graphs for explaining the operating mechanism of the adaptive bias current control of the comparator circuit of FIG. 5, in which FIG. 6A is a graph showing a relation between an input voltage $V_{IN}$ and an output voltage $V_{OUT}$ indicating that two curves intersect with each other, and FIG. 6B is a graph showing an existence of a region where both the two curves have finite voltage values in the vicinity of a reference voltage $V_{REF}$ in the graph of the relation;

FIGS. 15A, 15B and 15C are graphs showing simulation estimation results of the 2-stage comparator circuit of the first prior art of FIG. 2, in which FIG. 15A is a waveform chart showing an output response waveform when a triangular wave signal is inputted, FIG. 15B is an enlarged illustration of a rising waveform of the output response waveform of FIG. 15A, and FIG. 15C is an enlarged illustration of a falling waveform of the output response waveform of FIG. 15A;

FIGS. 16A, 16B and 16C are graphs showing simulation estimation results of the comparator circuit of the second prior art of FIG. 5, in which FIG. 16A is a waveform chart showing an output response waveform when a triangular wave signal is inputted, FIG. 16B is an enlarged illustration of a rising waveform of the output response waveform of FIG. 16A, and FIG. 16C is an enlarged illustration of a falling waveform of the output response waveform of FIG. 16A;

FIGS. 17A, 17B and 17C are graphs showing simulation estimation results of the comparator circuit of the second preferred embodiment of FIG. 9A, in which FIG. 17A is a waveform chart showing an output response waveform when a triangular wave signal is inputted, FIG. 17B is an enlarged illustration of a rising waveform of the output response waveform of FIG. 17A, and FIG. 17C is an enlarged illustration of a falling waveform of the output response waveform of FIG. 17A;

FIGS. 18A, 18B and 18C are graphs showing simulation estimation results of the comparator circuit of the fourth preferred embodiment of FIG. 13, in which FIG. 18A is a waveform chart showing an output response waveform when a triangular wave signal is inputted, FIG. 18B is an enlarged illustration of a rising waveform of the output response waveform of FIG. 18A, and FIG. 18C is an enlarged illustration of a falling waveform of the output response waveform of FIG. 18A;

FIGS. 19A, 19B and 19C are graphs showing simulation estimation results of the comparator circuit of the first prior art of FIG. 2, in which FIG. 19A is a waveform chart showing an output response waveform when a rectangular pulse signal is inputted, FIG. 19B is an enlarged illustration of a rising waveform of the output response waveform of FIG. 19A, and FIG. 19C is an enlarged illustration of a falling waveform of the output response waveform of FIG. 19A;

FIGS. 20A, 20B and 20C are graphs showing simulation estimation results of the comparator circuit of the second prior art of FIG. 5, in which FIG. 20A is a waveform chart showing an output response waveform when a rectangular pulse signal is inputted, FIG. 20B is an enlarged illustration of a rising waveform of the output response waveform of FIG. 20A, and FIG. 20C is an enlarged illustration of a falling waveform of the output response waveform of FIG. 20A;

FIGS. 21A, 21B and 21C are graphs showing simulation estimation results of the comparator circuit of the second preferred embodiment of FIG. 9A, in which FIG. 21A is a waveform chart showing an output response waveform when a rectangular pulse signal is inputted, FIG. 21B is an enlarged illustration of a rising waveform of the output response waveform of FIG. 21A, and FIG. 21C is an enlarged illustration of a falling waveform of the output response waveform of FIG. 21A;

FIGS. 22A, 22B and 22C are graphs showing simulation estimation results of the comparator circuit of the fourth preferred embodiment of FIG. 13, in which FIG. 22A is a waveform chart showing an output response waveform when a rectangular pulse signal is inputted, FIG. 22B is an enlarged illustration of a rising waveform of the output response waveform of FIG. 22A, and FIG. 22C is an enlarged illustration of a falling waveform of the output response waveform of FIG. 22A;

FIG. 23 is a table showing circuit configurations and descriptions of the comparator circuits estimated in the present application;

FIG. 24 is a table showing estimation results of delay times in the circuit configurations of FIG. 23;

DETAILED DESCRIPTION OF THE PREFERRED EMBODIMENTS

Figure 1:
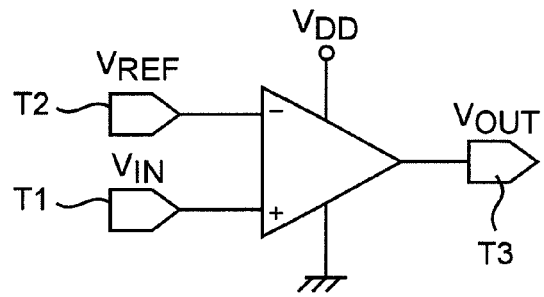
FIG. 1 is a circuit diagram showing a circuit symbol of a prior art comparator circuit.

Preferred embodiments of the present invention will be described below with reference to the drawings. It is noted that like components are denoted by like reference numerals in each of the preferred embodiments.

First Preferred Embodiment

Figure 7:
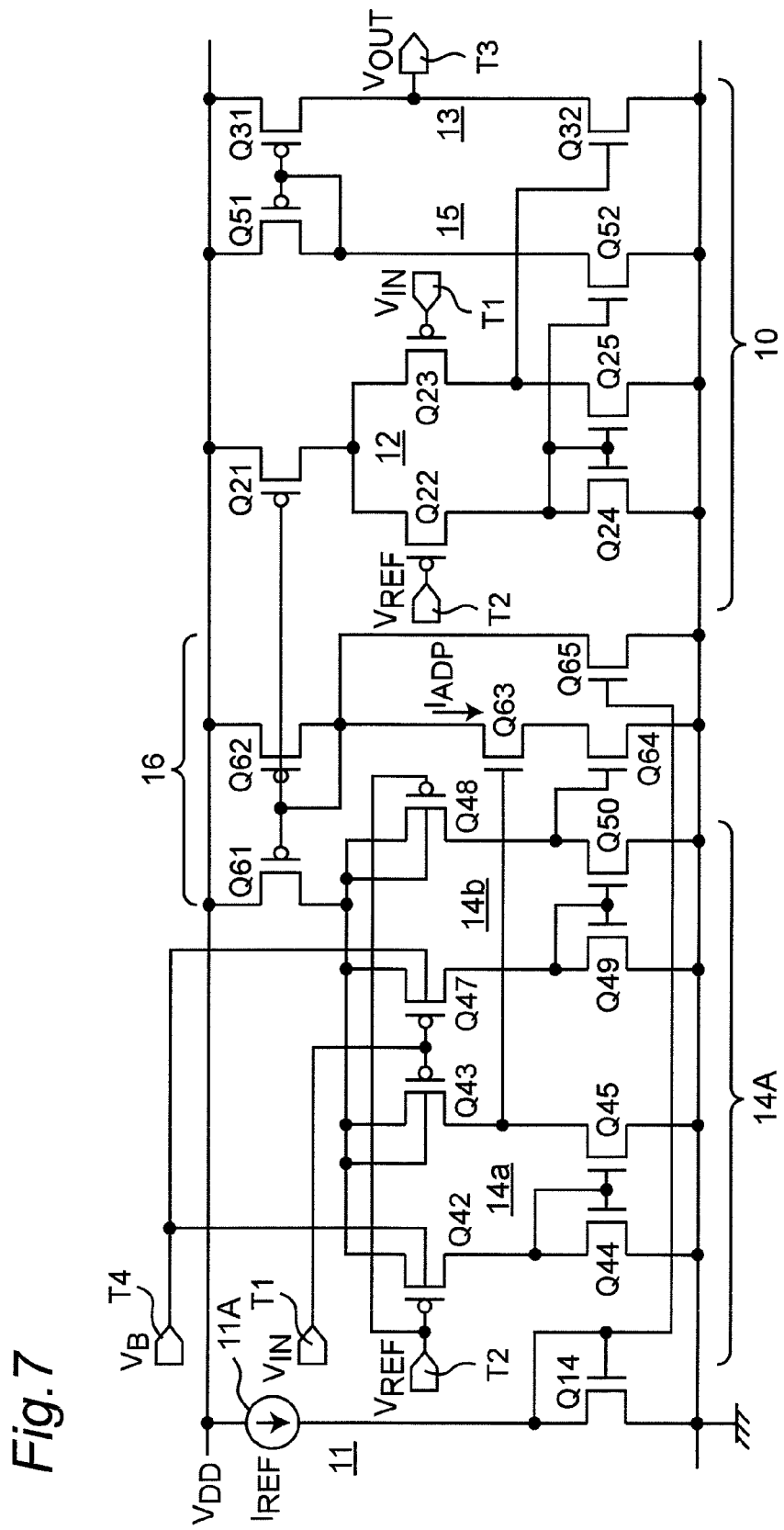
FIG. 7 is a circuit diagram showing a configuration of an adaptive bias current control system comparator circuit utilizing a body bias effect according to a first preferred embodiment of the invention.

FIG. 7 is a circuit diagram showing a configuration of an adaptive bias current control system comparator circuit utilizing a body bias effect according to the first preferred embodiment of the invention. The aforementioned comparator circuit of NPS Inc. (FIG. 5) operates in a subthreshold region. Therefore, the technique for generating an offset voltage by the size ratio of the differential pair configured to include the two differential amplifiers 14a and 14b and the size ratio of the current mirror circuits has had such a problem that the size ratio, which is contained in the logarithmic term, produces small effects appearing as an offset voltage and only a minute offset voltage can be generated.

In the first preferred embodiment of the invention, a technique for more effectively generating the offset voltage was estimated. The idea of utilizing the two differential amplifiers 14a and 14b is identical to the technique of the comparator circuit of FIG. 5. However, in contrast to the comparator circuit of FIG. 5 of the technique for changing the MOSFET size, the first preferred embodiment is characterized by using a technique for utilizing the body bias effect. Concretely, as shown in FIG. 7, a differential amplifier circuit 14A is configured so that the virtual grounding points of the two differential amplifiers 14a and 14b of the adaptive bias current generator circuit 14 are made common, the semiconductor substrate (N well) of input MOSFETs Q43 and Q48 on one side of the two differential amplifiers 14a and 14b is connected to the source electrode, and the semiconductor substrate (N well) of input MOSFETs Q42 and Q47 on the other side is connected to a terminal T4 of a predetermined bias voltage $V_B$. The other circuit configuration is similar to that of the comparator circuit of FIG. 5. It is noted that the reference numeral 16 denotes a bias control circuit, which is configured to include five MOSFETs Q61 to Q65, generates an adaptive control current $I_{ADP}$ by detecting the operating current of the adaptive bias current generator circuit 14A and detects a current $I_{REF}$ from the MOSFET Q14 to reflect the current on the adaptive control.

According to the comparator circuit as configured as above, the threshold voltages of the input MOSFETs Q42 and Q47 of which the substrate or body potential is connected to the bias voltage $V_B$ changes, and this leads to the input offset voltage of the differential amplifiers 14a and 14b. Concretely, the threshold voltage can be raised when the source voltage $V_S$ is lower than the bias voltage $V_B$, and the threshold voltage can be lowered when the source voltage $V_s$ is higher than the bias voltage $V_B$ of the MOSFETs Q42 and Q47. Therefore, by intentionally applying the offset voltage to the two differential amplifiers 14a and 14b, it is possible to generate, for example, a larger adaptive control current $I_{ADP}$ and to operate the comparator circuit at higher speed than those of prior art.

Figure 8:
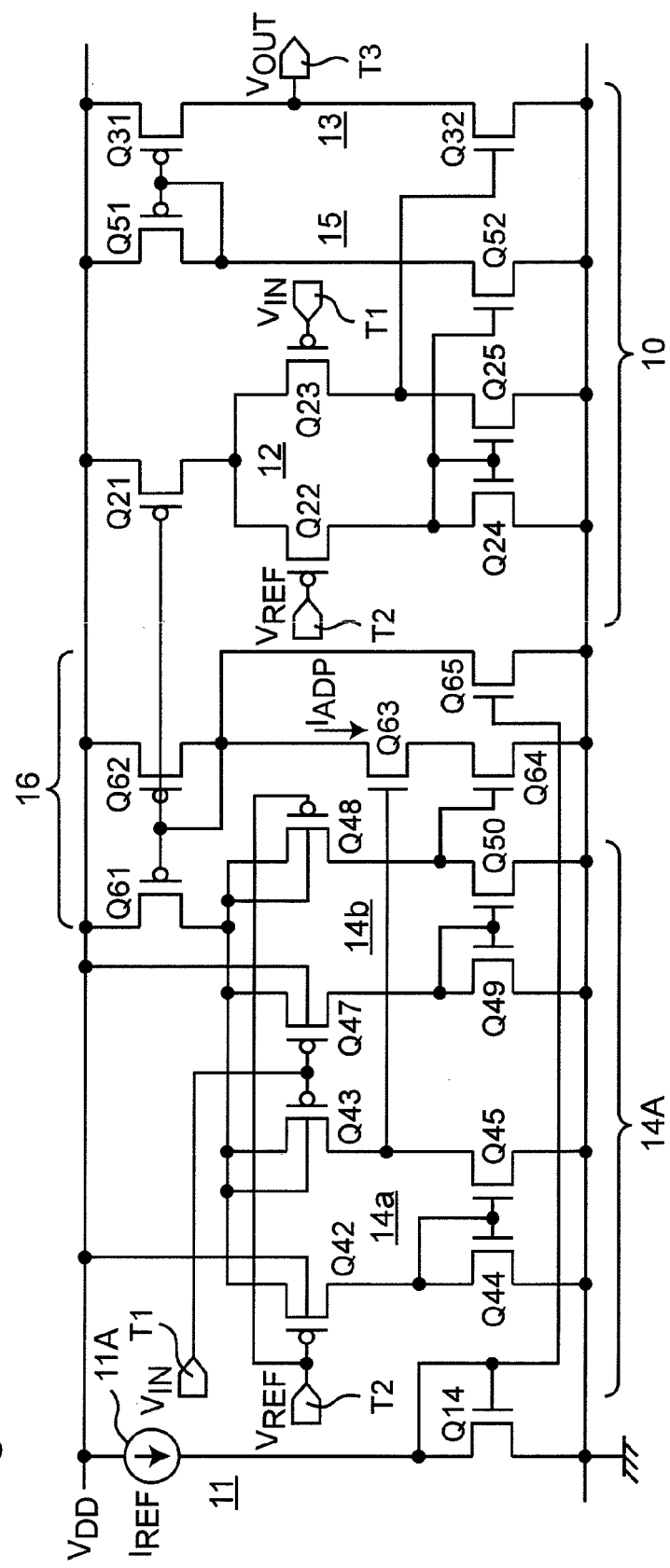
FIG. 8 is a circuit diagram showing a configuration of a comparator circuit according to a modified preferred embodiment of the first preferred embodiment.

FIG. 8 is a circuit diagram showing a configuration of a comparator circuit according to a modified preferred embodiment of the first preferred embodiment. The comparator circuit of FIG. 8 is characterized in that a power supply voltage $V_{DD}$ is utilized as the bias voltage $V_B$ by comparison with the comparator circuit of FIG. 7. With this arrangement, the threshold voltages of the input MOSFETs Q42 and Q47 are changed only by the body bias effect, and the offset voltages of the differential amplifiers 14a and 14b can be generated. Therefore, by intentionally applying the offset voltage to the two differential amplifiers 14a and 14b, it is possible to generate, for example, a larger adaptive control current $I_{ADP}$ and to operate the comparator circuit at higher speed than those of prior art.

Second Preferred Embodiment

Figure 9A:
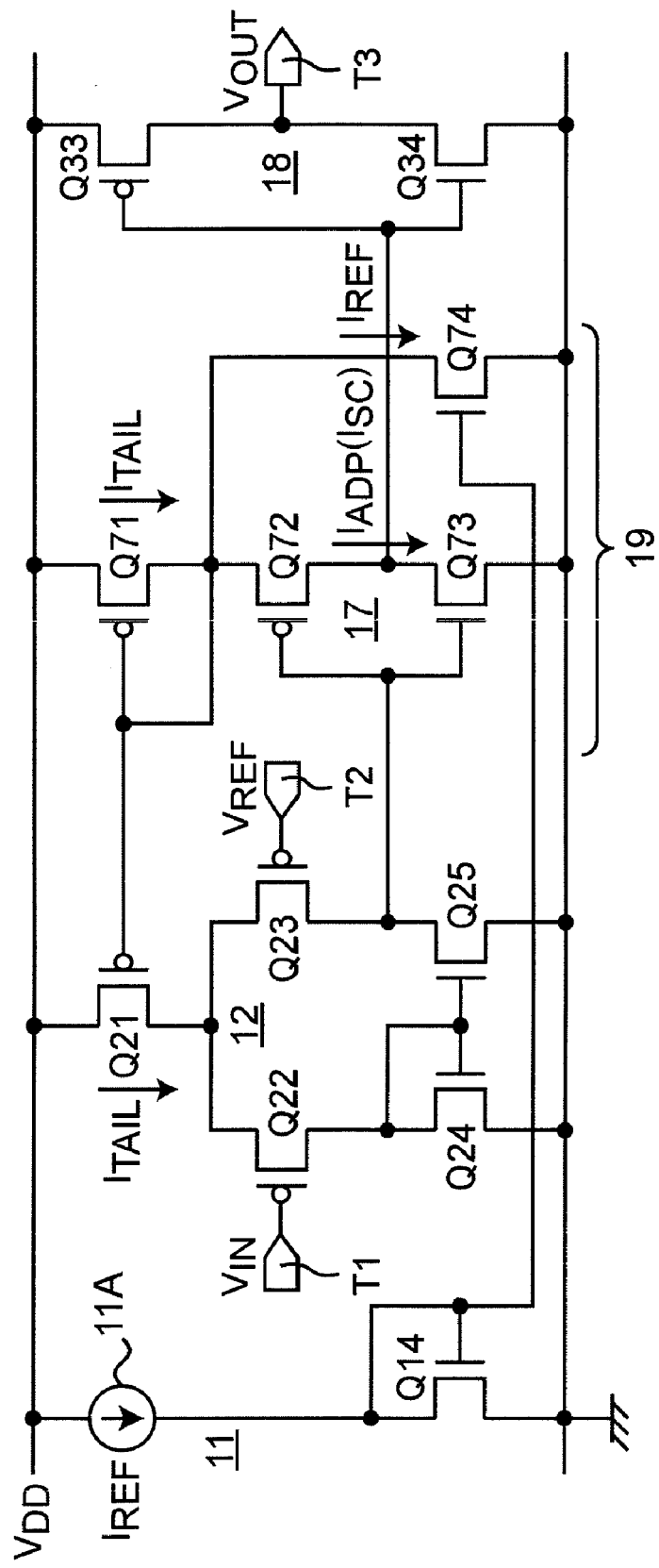
FIG. 9A is a circuit diagram showing a configuration of an adaptive bias current control system comparator circuit using a through current $I_{SC}$ of a CMOS inverter circuit according to a second preferred embodiment of the invention.

FIG. 9A is a circuit diagram showing a configuration of an adaptive bias current control system comparator circuit that utilizes the through current $I_{SC}$ of a CMOS inverter circuit according to the second preferred embodiment of the invention. In the configuration of the comparator circuit proposed by the first preferred embodiment and its modified preferred embodiment, two differential amplifiers 14a and 14b are required for the adaptive bias current generator circuit 14. For the above reasons, there is such a problem that the mounting scale of the circuit is relatively large. Accordingly, a circuit configuration capable of remarkably reducing the circuit scale was estimated. It is noted that the through current $I_{SC}$ of the CMOS inverter circuit is defined as a current that flows when the MOSFETs are both turned on.

FIG. 9A is characterized by including such a circuit configuration that the output voltage of the differential amplifier 12 is monitored by an inverter circuit 17 configured to include MOSFETs Q72 and Q73, the adaptive control current $I_{ADP}$ that is the through current $I_{SC}$ corresponding to the monitored output voltage is added to the bias current $I_{REF}$ detected by the MOSFET Q74, and the current of the addition result is served as the tail current of the differential amplifier 12. In this case, the current mirror circuit is configured to include the MOSFETs Q14 and Q74, and the bias current $I_{REF}$ is detected by the current mirror circuit.

In no operation of the differential amplifier 12, the inverter circuit 17 does not operate, and the differential amplifier 12 monitors the input signal by the bias current $I_{REF}$. The output voltage of the differential amplifier 12 changes when a changeover occurs between the input voltage $V_{IN}$ and the reference voltage $V_{REF}$, and this signal is detected by the inverter circuit 17. Since the inverter circuit 17 flows the through current $I_{SC}$ at the time of detection, the current is utilized as the tail current $I_{TAIL}$ of the differential amplifier 12. That is, the MOSFETs Q71 and Q21 constitute a current mirror circuit, and the MOSFET Q71 detects the bias current $I_{REF}$ or the through current $I_{SC}$ and flows a current corresponding to and being identical to the current as the tail current $I_{TAIL}$ through the differential amplifier 12, and this leads to that a larger tail current $I_{TAIL}$ is flowed to improve the operating speed. Therefore, the circuit configured to include the MOSFETs Q71 to Q74 constitutes an adaptive bias current generator circuit 19. Further, the output voltage of the inverter circuit 17 is outputted to an output terminal T3 via an inverter circuit 18 configured to include the MOSFETs Q33 and Q34. Since the output voltage of the differential amplifier 12 does not make a full swing in the circuit, the inverter circuit 18 is connected to the output stage to make a full swing. It is noted that the full swing is defined as a swing from the ground potential to the power supply voltage $V_{DD}$.

The differential amplifier 12 operates with a minute current $I_{REF}$ until the inverter circuit 17 detects the inversion of the output of the differential amplifier 12. For the above reasons, there is such a problem that minute current driving is performed during time until the logical changeover occurs, and the operating speed becomes slow. However, since the logical inversion voltage is a low voltage and the parasitic capacitance value has an order of several tens of femto-farads, the logical inversion is possible within several micro-seconds.

Figure 9B:
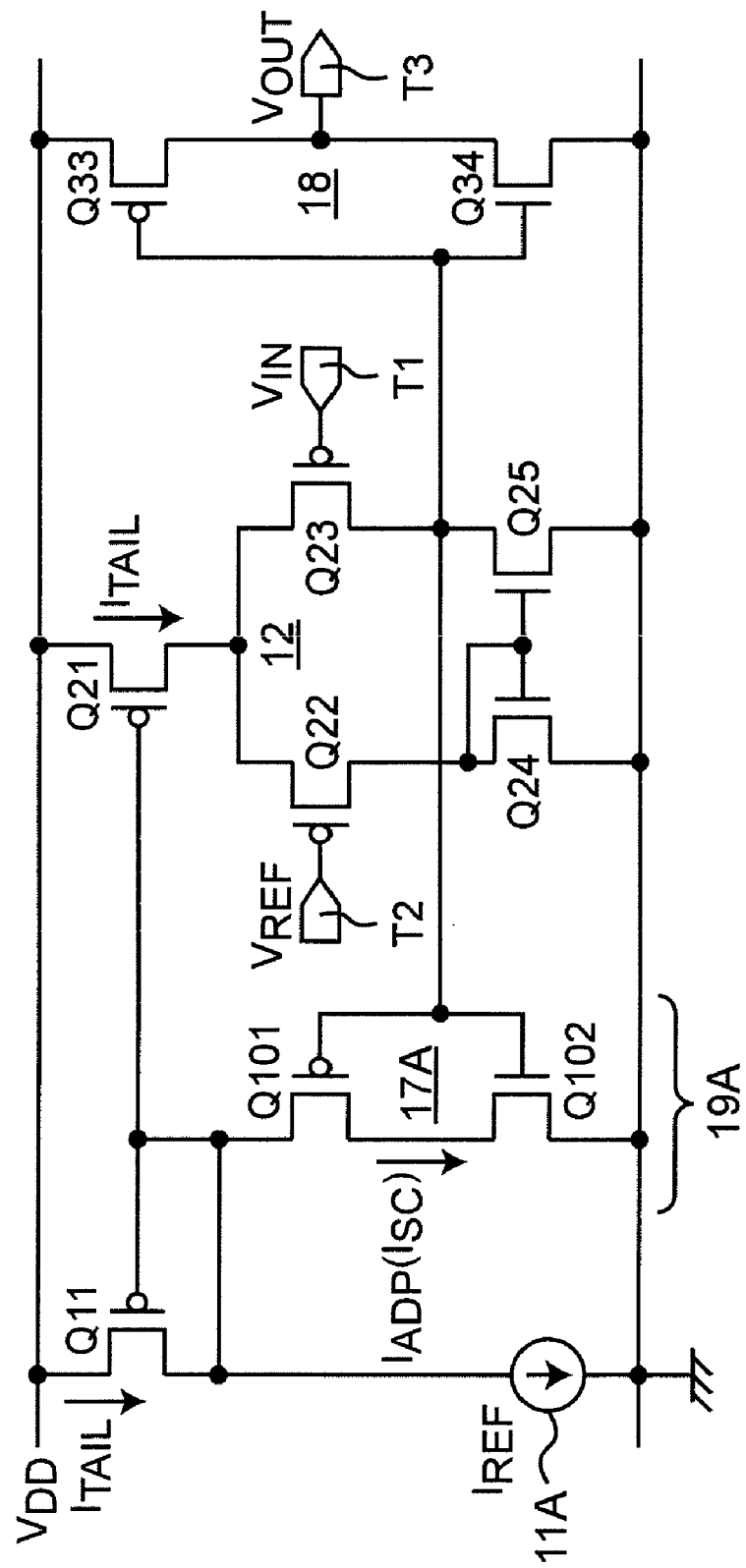
FIG. 9B is a circuit diagram showing a configuration of an adaptive bias current control system comparator circuit using the through current $I_{SC}$ of the CMOS inverter circuit according to a modified preferred embodiment of the second preferred embodiment of the invention.

FIG. 9B is a circuit diagram showing a configuration of an adaptive bias current control system comparator circuit that uses the through current $I_{SC}$ of the CMOS inverter circuit according to a modified preferred embodiment of the second preferred embodiment of the invention. The comparator circuit of FIG. 9B is characterized by including an adaptive bias current generator circuit 19A that has the inverter circuit 17A in place of the adaptive bias current generator circuit 19 by comparison with the comparator circuit of FIG. 9A. Referring to FIG. 9B, the output voltage of the differential amplifier 12 is monitored by the inverter circuit 17A. The adaptive control current $I_{ADP}$ of the through current $I_{SC}$ flows when the inverter circuit 17A is logically inverted. A current obtained by adding the current to the bias current $I_{REF}$ is made to flow as the tail current $I_{TAIL}$ of the differential amplifier 12 via the current mirror circuit configured to include the MOSFETs Q11 and Q21. In this case, since the output voltage of the differential amplifier 12 does not make a full swing, the inverter circuit 18 is connected to the output stage to make a full swing.

In no operation of the differential amplifier 12, the inverter circuit 17A does not operate, and the differential amplifier 12 monitors the signal by the bias current $I_{REF}$. The output voltage of the differential amplifier 12 changes when a changeover occurs between the input voltage $V_{IN}$ and the reference voltage $V_{REF}$, and this signal is detected by an inverter circuit 17A. Since the inverter circuit 17A flows the adaptive bias current $I_{ADP}$ of the through current $I_{sc}$ at the time of detection, and the current is utilized as the tail current $I_{TAIL}$ of the differential amplifier 12 to improve the operating speed. Until the inverter circuit 17A detects the output inversion of the differential amplifier 12, the differential amplifier 12 operates with the minute current $I_{REF}$. After the detection, the differential amplifier 12 operates with a current of $I_{REF}$+ $I_{ADP}$. When the output voltage of the differential amplifier 12 changes, the inverter circuit 18 of the output stage makes a full swing of the change to output an output signal of a logical value.

In the differential amplifier 12 of the comparator circuit of the second preferred embodiment, the bias current $I_{REF}$ and the adaptive bias current $I_{ADF}$ are monitored by one current mirror circuit to apply a bias to the differential amplifier 12. Therefore, it has been necessary to use a long-channel device in order to secure the current mirror accuracy of the pMOS current mirror circuit. The diode-connection MOSFET Q71 of the current mirror circuit consistently monitors the bias current $I_{REF}$, and therefore, it is necessary to estimate a voltage drop due to the MOSFET Q71. That is, since the inverter circuit 17 to monitor the logical inversion is connected to the MOSFET Q71, the high-level logical voltage of the inverter circuit 17 becomes a voltage that is lower than the power supply voltage $V_{DD}$ by several hundreds of milli-volts. The influence of the voltage drop sometimes influences the inverter circuit 18 of the final stage. That is, since the high-level logic of the inverter circuit 17 of the preceding stage becomes the voltage lower than the power supply voltage $V_{DD}$, there is a possibility of generating a leak current in the inverter circuit 18 of the final stage, or in particular, the pMOSFET Q33 and consequently increasing the power.

Figure 10:
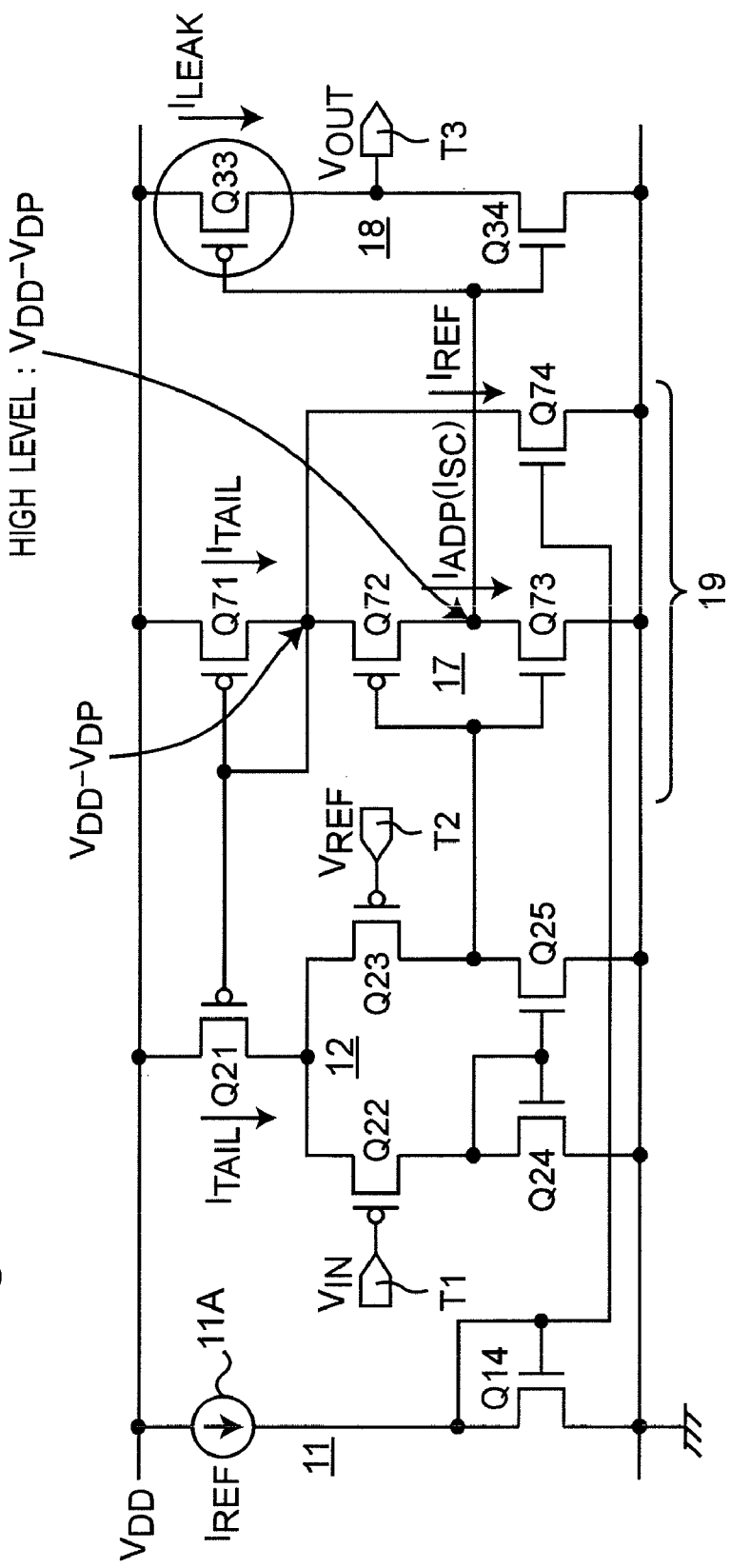
FIG. 10 is a circuit diagram showing a problem of the leak current of an inverter 13 of the final stage of FIG. 9A.

FIG. 10 is a circuit diagram showing a problem of the leak current of the inverter 18 of the final stage of FIG. 9A. The above behavior is shown in FIG. 10, in which the output voltage of the differential amplifier 12 becomes low level when the input voltage $V_{IN}$ is lower than the reference voltage $V_{REF}$. Then, the inverter circuit 18 of the output stage detects the low level signal and outputs high level. However, because of the existence of the current mirror circuit (MOSFET Q71) that monitors the bias current $I_{REF}$ and the adaptive bias current $I_{ADP}$ in the upper row of the inverter circuit 17, the high-level logical level outputted from the inverter circuit 17 becomes a voltage ($V_{DD}$-$V_{DP}$) lower than the power supply voltage $V_{DD}$. In this case, $V_{DP}$ is the drain-source $V_{DS}$ of the pMOSFET Q71. Therefore, the gate-source voltage $V_{GS}$ of the pMOSFET Q33 of the inverter circuit 18 of the final stage at this time becomes the voltage $V_{DP}$. The voltage $V_{DP}$ possibly flows a leak current $I_{LEAK}$.

Third Preferred Embodiment

Figure 11:
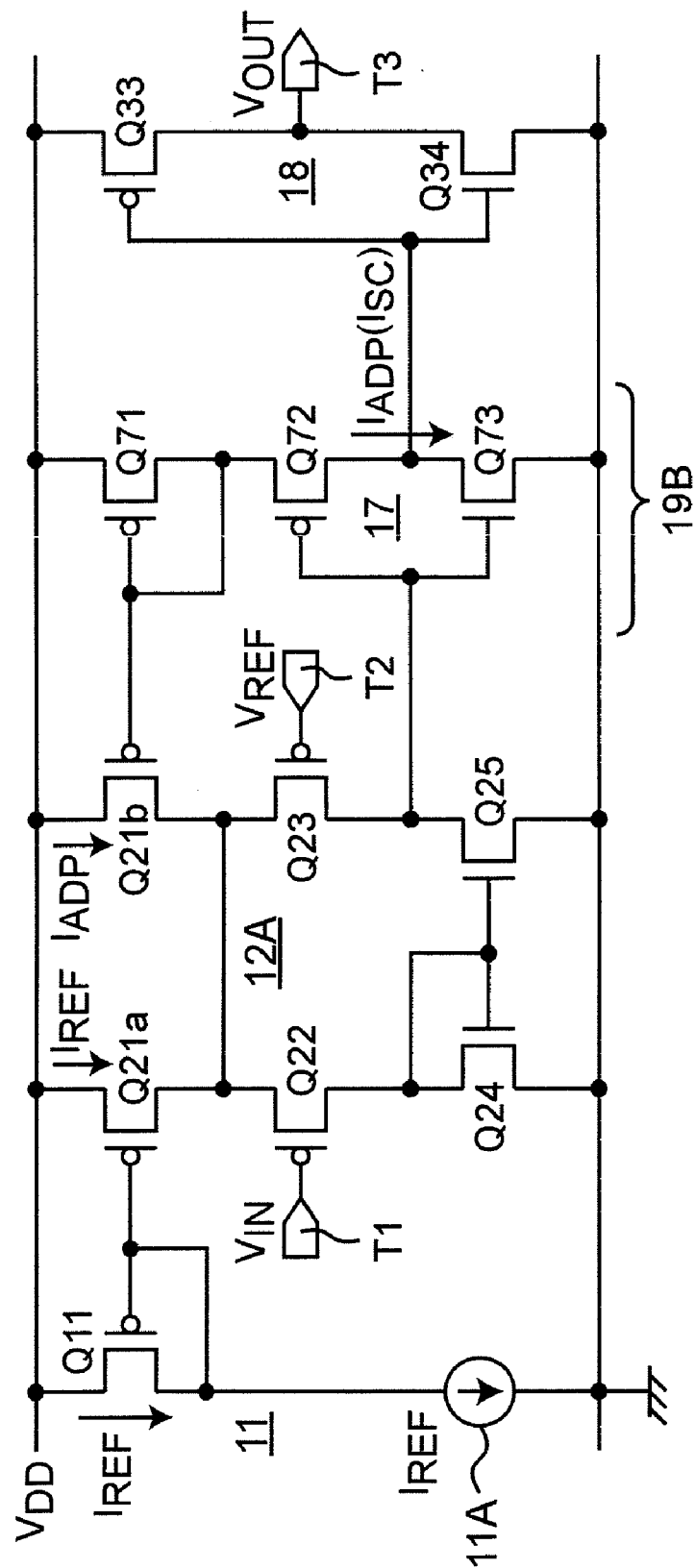
FIG. 11 is a circuit diagram showing a configuration of a comparator circuit according to a third preferred embodiment of the invention, in which the leak current of the inverter 13 of the final stage is reduced to solve the problem of the comparator circuit of FIG. 10.

FIG. 11 is a circuit diagram showing a configuration of a comparator circuit according to the third preferred embodiment of the invention, in which the leak current of the inverter 13 of the final stage is reduced to solve the problem of the comparator circuit of FIG. 10. In order to solve the problem of the comparator circuit of FIG. 10, the circuit is characterized by including an adaptive bias current generator circuit 19B, in which a generator circuit of the minute bias current $I_{REF}$ and a generator circuit of the adaptive bias current $I_{ADP}$ of the through current $I_{SC}$ are configured to include separate current mirror circuits.

In the differential amplifier 12A of FIG. 11, the bias current $I_{REF}$ is applied as a bias to the differential amplifier 12A via a current mirror circuit configured to include MOSFETs Q11 and Q21a. Likewise, the adaptive bias current $I_{ADP}$ of the through current $I_{SC}$ of the inverter circuit 17 is applied as a bias to the differential amplifier 12 via a current mirror configured to include MOSFETs Q71 and Q21b. Since both the bias current $I_{REF}$ and the adaptive bias current $I_{ADP}$ are monitored by one current mirror circuit in the comparator circuit shown in FIG. 10, the voltage $V_{DP}$ becomes relatively large. In contrast to this, since the voltage $V_{DP}$ can be set small by separating the bias current $I_{REF}$, the influence of the leak current $I_{LEAK}$ of the inverter circuit 18 of the final stage can be suppressed.

Figure 12:
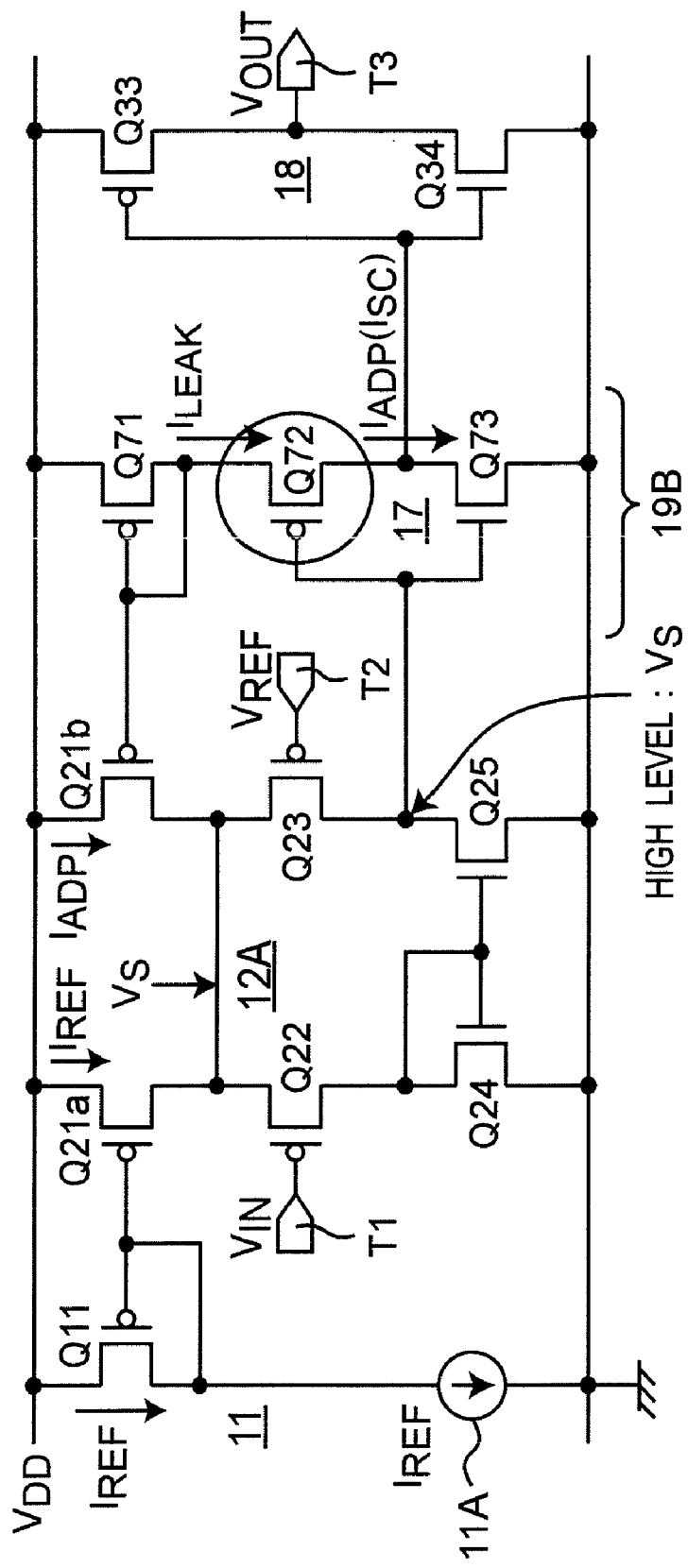
FIG. 12 is a circuit diagram for indicating the problem of the leak current of the first-stage inverter circuit in the comparator circuit of FIG. 11.

FIG. 12 is a circuit diagram for indicating the problem of the leak current of the first-stage inverter circuit in the comparator circuit of FIG. 11. Such a circuit configuration that the differential amplifiers 12 and 12A described in the second and third preferred embodiments are combined with the inverter circuits 17 and 18 is strongly influenced by a common mode voltage (average voltage) dependence of the input voltage $V_{IN}$ and the reference voltage $V_{REF}$. This sometimes leads to such a problem that the high level of the differential amplifier 12 generates the leak current $I_{LEAK}$ of the inverter circuit 17. FIG. 12 shows this behavior. The voltage of the source electrodes of the input MOSFETs Q22 and Q23 of the differential amplifier 12A is served as the source voltage $V_S$. Since the high level of the output voltage of the differential amplifier 12A becomes the source voltage $V_S$, the output voltage of the differential amplifier 12 changes in accordance with the common mode voltage (average voltage) of the input voltage $V_{IN}$ and the reference voltage $V_{REF}$. In general, the source voltage $V_S$ changes depending on the input voltage $V_{IN}$ and the reference voltage $V_{REF}$. In this case, there is such a problem that the leak current $I_{LEAK}$ of the pMOSFET Q72 is generated by a phenomenon similar to the problem described with reference to FIG. 10 when the output voltage of the differential amplifier 12A becomes excessively low.

Fourth Preferred Embodiment

Figure 13:
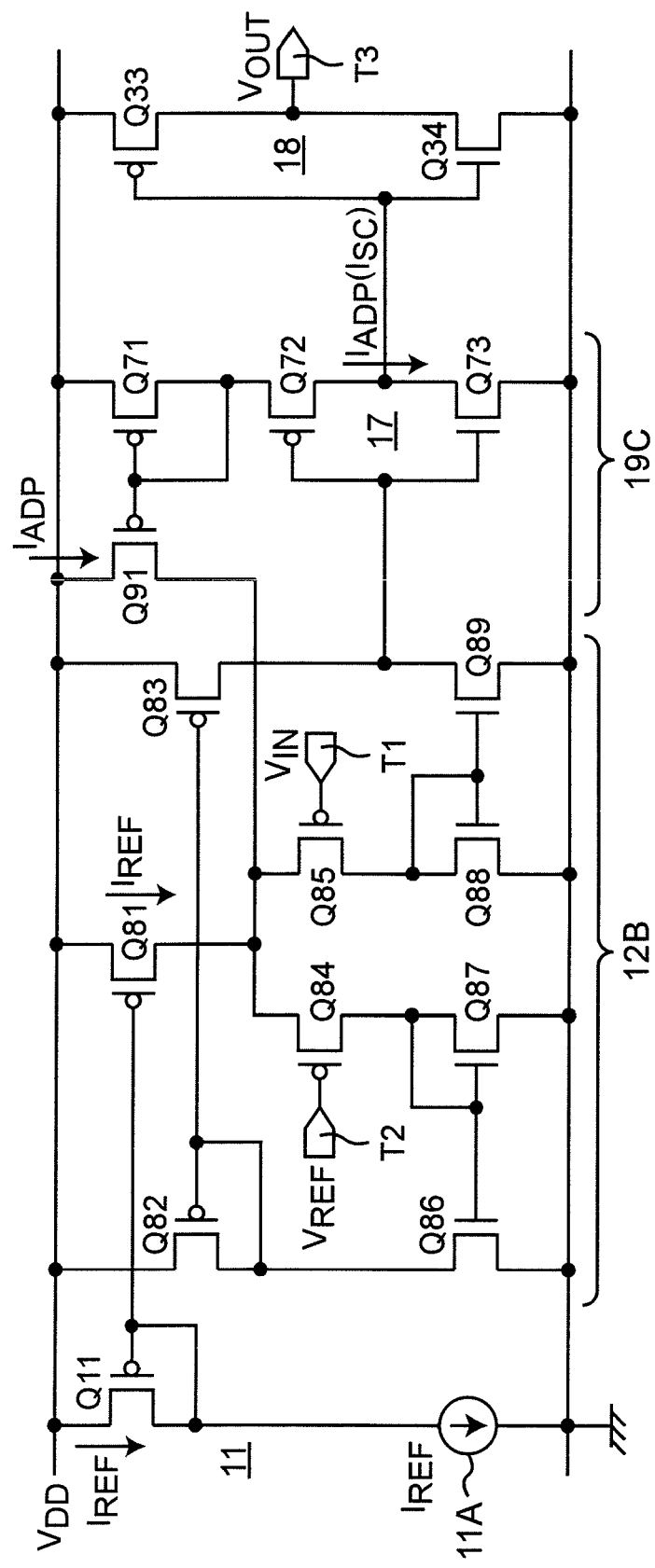
FIG. 13 is a circuit diagram showing a configuration of a comparator circuit according to a fourth preferred embodiment of the invention to solve the problem of the comparator circuit of FIG. 12.

FIG. 13 is a circuit diagram showing a configuration of a comparator circuit according to the fourth preferred embodiment of the invention to solve the problem of the comparator circuit of FIG. 12. The comparator circuit of FIG. 13 is characterized by including a wide-range differential amplifier (referred to as a differential amplifier that has a larger dynamic range than that of the differential amplifier 12) 12B based on a current mirror circuit in place of the differential amplifier 12 for the input use. In this case, the wide-range differential amplifier based on the current mirror circuit may be, for example, an operational transconductance amplifier (OTA).

Referring to FIG. 13, the wide-range differential amplifier 12B is configured to include pMOSFETs Q81 to Q85 and nMOSFETs Q86 to Q89. A current mirror circuit for wide-range operation is configured to include the pMOSFETs Q82 and Q83, a current mirror circuit to detect the bias current $I_{REF}$ is configured to include pMOSFETs Q11 and Q81, and a current mirror circuit to detect the adaptive bias current $I_{ADP}$ of the through current $I_{SC}$ of the inverter circuit 17 is configured to include pMOSFETs Q71 and Q91, and this leads to configuration of an adaptive bias current generator circuit 19C. With the above arrangement, the output voltage of the first-stage amplifier can make a full swing, and therefore, the influence of the common mode dependence of the input voltage $V_{IN}$ and the reference voltage $V_{REF}$ on the inverter circuit 17 of the subsequent stage can be removed.

Although the circuit configuration of FIG. 13 is obtained by applying the wide range differential amplifier 12B to the comparator circuit of the preferred embodiment of FIG. 12, it is acceptable to apply the wide range differential amplifier 12B to the comparator circuits of the other preferred embodiments.

It is noted that the circuit configuration of FIG. 13 obtains a full-swing characteristic capable of making a swing from 0 V to the power supply voltage $V_{DD}$ in the first-stage amplifier. However, it is practically not necessary to make a full swing in this stage. In particular, an operating delay might occur due to full swing, and this sometimes causes the problem.

Figure 14:
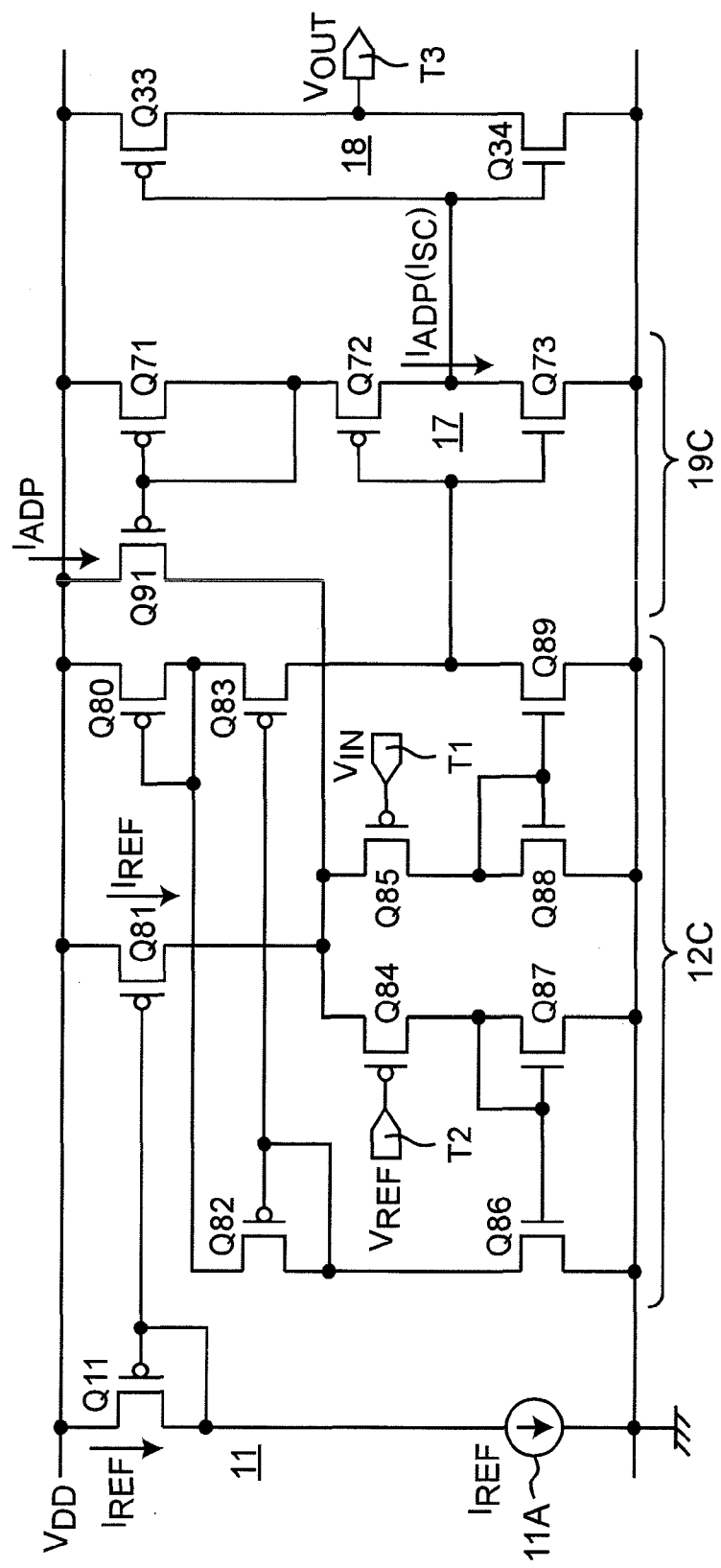
FIG. 14 is a circuit diagram showing a configuration of a comparator circuit according to a modified preferred embodiment of the fourth preferred embodiment of the invention.

FIG. 14 is a circuit diagram showing a configuration of a comparator circuit according to a modified preferred embodiment of the fourth preferred embodiment of the invention. The comparator circuit of FIG. 14 is characterized in that a differential amplifier 12C is constituted by inserting a diode-connection MOSFET Q80 in the power source of the first-stage amplifier by adopting a technique for limiting the output amplitude of the first-stage amplifier by comparison with the comparator circuit of FIG. 13. A current of $2I_{REF}$ normally flows through the MOSFET Q80. Effective output amplitude becomes $V_{DD}$-$V_{Dp1}$ due to this current. In this case, the voltage $V_{DP1}$ is the drain-source voltage $V_{DS}$ of the diode-connection MOSFET Q80. The voltage $V_{DP1}$ generates a voltage drop caused by the flow of the current of $2I_{REF}$, consequently limiting the full swing. It is noted that the amount of current is free of the common mode dependence of the input voltage $V_{IN}$ and the reference voltage $V_{REF}$, and therefore, the problem of the leak current $I_{LEAK}$ of the inverter circuit 17 mentioned as the problem hereinabove can also be avoided.

Figure 31:
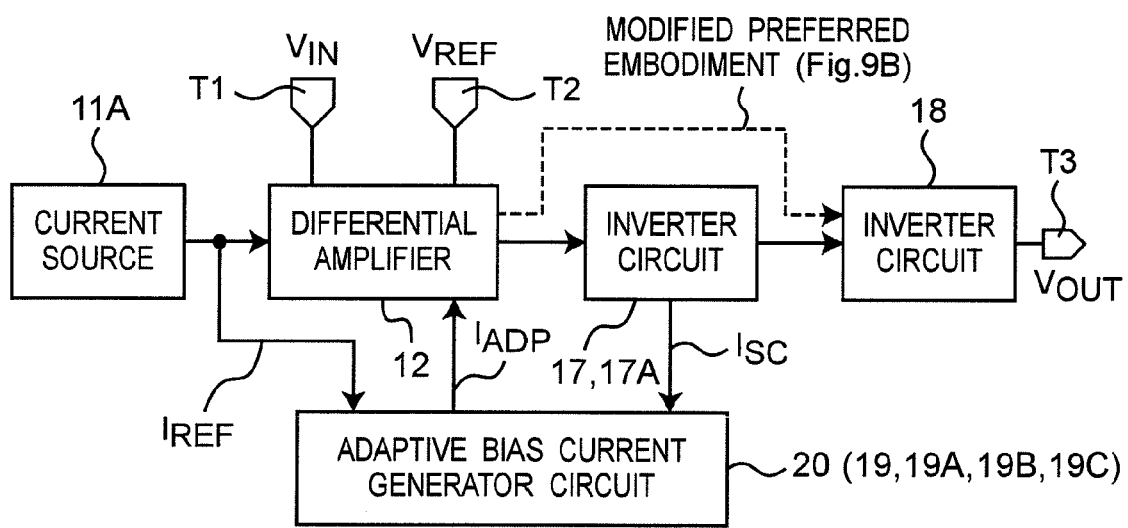
FIG. 31 is a block diagram showing a configuration of the comparator circuits of the second preferred embodiment and the third preferred embodiment.

Circuit Configuration of Second Preferred Embodiment and Third Preferred Embodiment FIG. 31 is a block diagram, which shows a configuration of the comparator circuits of the second preferred embodiment and the third preferred embodiment, and comprehensively illustrates the configuration of these comparator circuits based mainly on the operation.

Referring to FIG. 31, the comparator circuit includes a differential amplifier 12 that compares the input voltage with the reference voltage, makes a logical judgment, generates an output voltage of the logical judgment result and outputs the voltage, and a current source 11A that generates a bias current $I_{REF}$ of a predetermined minute current and supplies the current to the differential amplifier. The inverter circuits 17 and 17A output an inverted signal by inverting a differential voltage from the differential amplifier 12. An adaptive bias current generator circuit 20 (reference numerals 19, 19A, 19B and 19C are generically denoted by 20) detects the bias current $I_{REF}$ of the current source 11A, detects the through current $I_{SC}$ of the inverter circuits 17 and 17A, and generates the adaptive bias current $I_{ADP}$ for executing the adaptive bias current control in a manner that, based on the detected bias current $I_{REF}$ and the detected through current $I_{SC}$, the differential amplifier 12 is operated with the bias current $I_{REF}$ for a time interval when the differential amplifier 12 makes no logical judgment and the differential amplifier 12 is operated with the bias current $I_{ADP}$ obtained by increasing the bias current $I_{REF}$ for a time interval when the differential amplifier 12 makes a logical judgment to supply the current to the differential amplifier.

In the third preferred embodiment of FIG. 11, the adaptive bias current generator circuit 20 (19B) separately detects the bias current $I_{REF}$ of the current source 11A and the through current $I_{SC}$ of the inverter circuit 17. Moreover, in the second preferred embodiment of FIG. 9A, the adaptive bias current generator circuit 20 (19) detects the bias current $I_{REF}$ of the current source 11A and adds the detected bias current $I_{REF}$ to the through current $I_{SC}$ of the inverter circuit 17 to generate the adaptive bias current $I_{ADP}$. Further, in the modified preferred embodiment of the second preferred embodiment of FIG. 9B, the adaptive bias current generator circuit 20 (19A) detects the through current $I_{sc}$ of the inverter circuit 17A and adds the detected through current $I_{SC}$ to the bias current $I_{REF}$ of the current source 11A to generate the adaptive bias current $I_{ADP}$. Furthermore, in the preferred embodiments of FIGS. 11 and 9A, the inverter circuit 18 inverts the output voltage from the inverter circuit 17 and outputs a resulting voltage. Moreover, in the modified preferred embodiment of the second preferred embodiment of FIG. 9B, the output voltage from the differential amplifier 12 is inverted and outputted. Although the adaptive bias current generator circuit 20 (19C) operates in a manner similar to that of the third preferred embodiment of FIG. 11 in the fourth preferred embodiment of FIG. 13 that employs the wide-range differential amplifier 12B, it is acceptable to apply the wide-range differential amplifier 12B to the adaptive bias current generator circuits 19, 19A, 19B and so on regarding the application of the amplifier.

Implemental Examples

The present inventor and others carried out simulation estimation by the Monte Carlo simulation to carry out the operation estimation of the comparator circuit of the proposed present preferred embodiments. Both of D2D (Die-to-Die) variation and WID (Within Die) variation were considered. The trial frequency was 100 times.

A triangular wave signal and a rectangular pulse signal were used as an input signal. In this case, it is necessary to design optimal design parameters (parameters of the gate length L, the gate width W and so on of MOSFET). In the present estimation, circuit designing was performed with the characteristics at the time of the triangular wave signal input served as a criterion. This is because the designing technique is different between the case of the triangular wave signal input and the case of the rectangular pulse signal input. In detail, there is such a problem that the power disadvantageously becomes very large at the time of the triangular wave signal input when the circuit designing is performed with the rectangular pulse signal input served as a criterion and the circuit parameter setting is optimized. In particular, when the triangular wave signal is inputted to the comparator circuit proposed by NPS Inc. or a bulk comparator circuit of which the substrate or body electric potential is controlled, the adaptive bias current control circuits of NPS Inc. and the bulk comparator circuit output high-level outputs for a long term. Therefore, the current generating MOSFET outputs a large amount of current, and the power increase becomes significant. For the above reasons, the circuit designing is performed with the case of the triangular wave signal input served as a criterion.

First of all, the response characteristic at the time of the triangular wave signal input is described as follows. The estimation was made by setting the power supply voltage $V_{DD}$ to 3.0 V and the reference voltage $V_{REF}$ to 1.5 V as simulation conditions, and inputting two triangular wave signals of 500 Hz as input signals. Moreover, the bias current was set to $I_{REF}$=10 nA. It is assumed that the load capacitance, i.e., the capacitance connected to the output terminal T3 is 1 pF.

Figure 2:
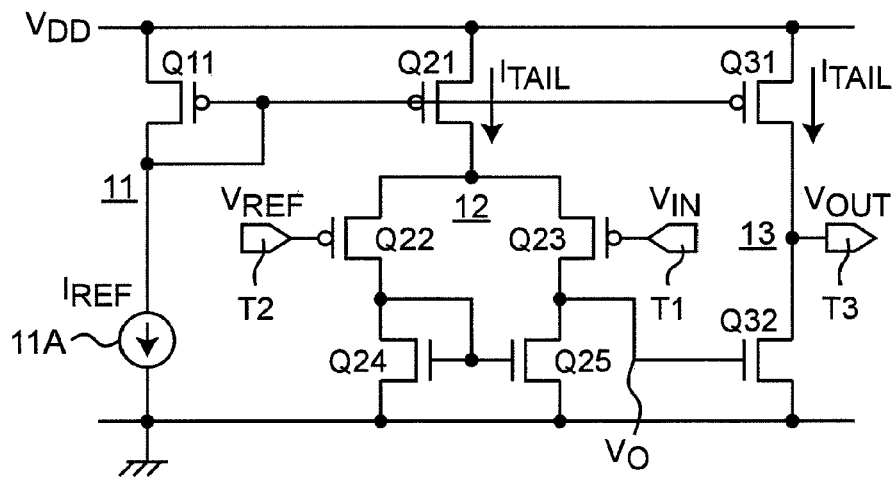
FIG. 2 is a circuit diagram showing a configuration of a 2-stage comparator circuit according to a first prior art.
Figure 3:
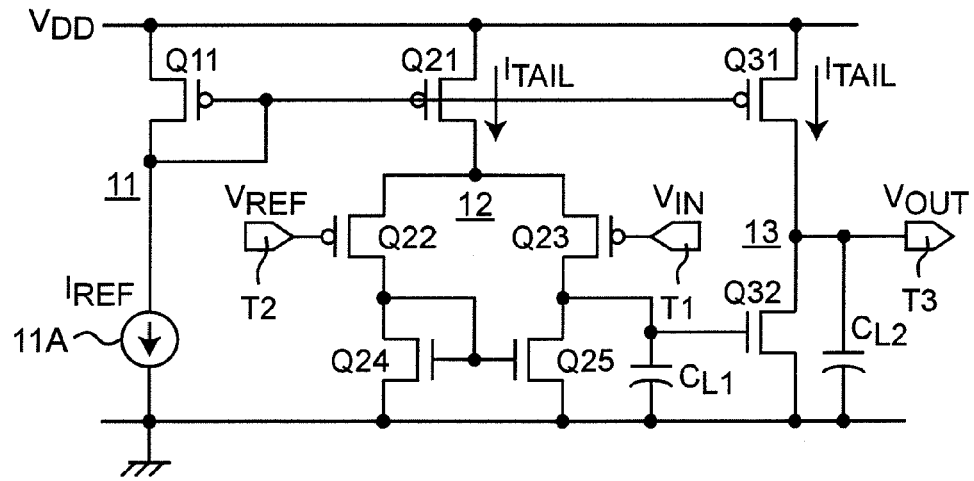
FIG. 3 is a circuit diagram upon taking parasitic capacitances $C_{L1}$ and $C_{L2}$ into consideration in the 2-stage comparator circuit of FIG. 2.
Figure 4:
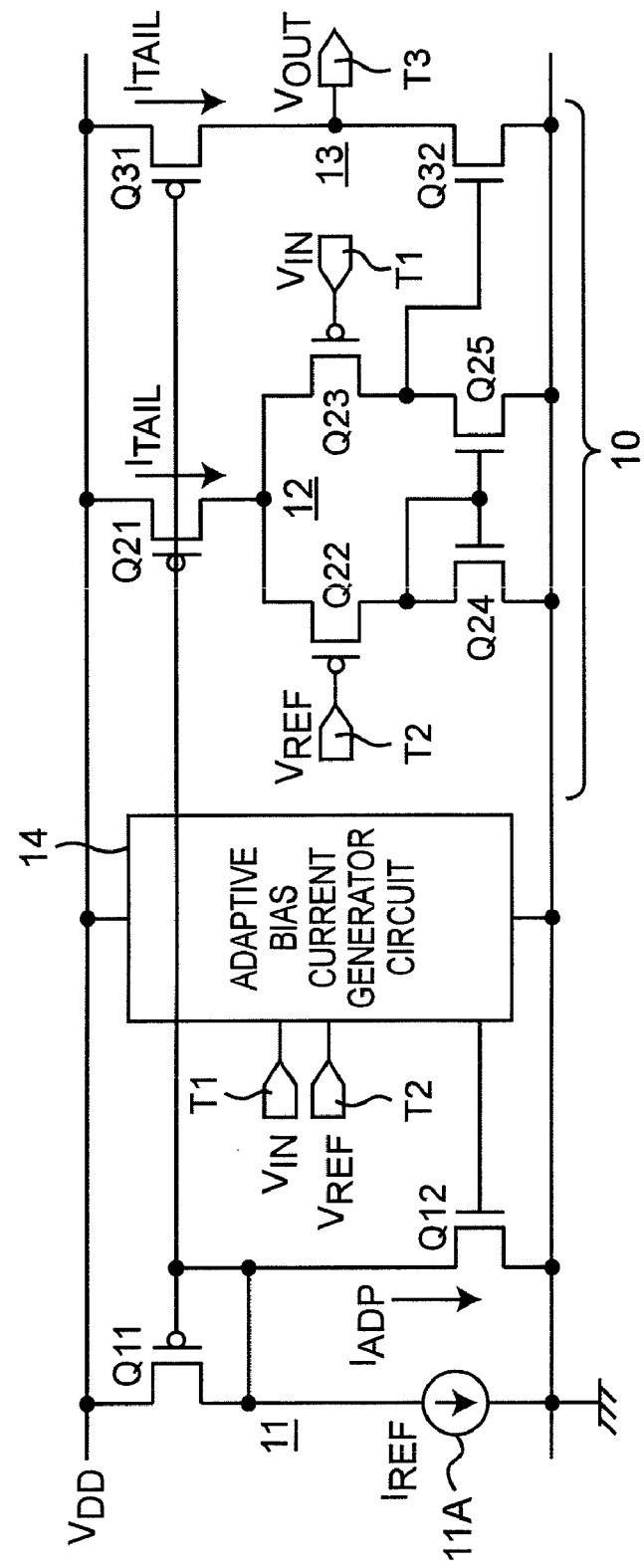
FIG. 4 is a circuit diagram showing a configuration of a comparator circuit using a speed-up technique with an adaptive bias current in the 2-stage comparator circuit of FIG. 2.
Figure 15A:
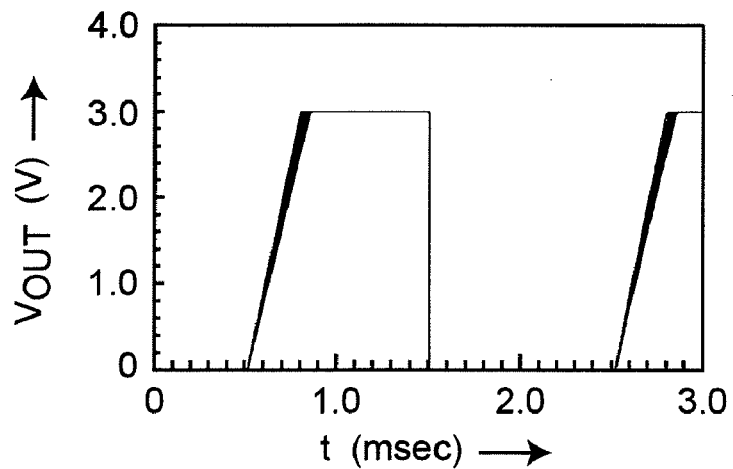
Figure 15B:
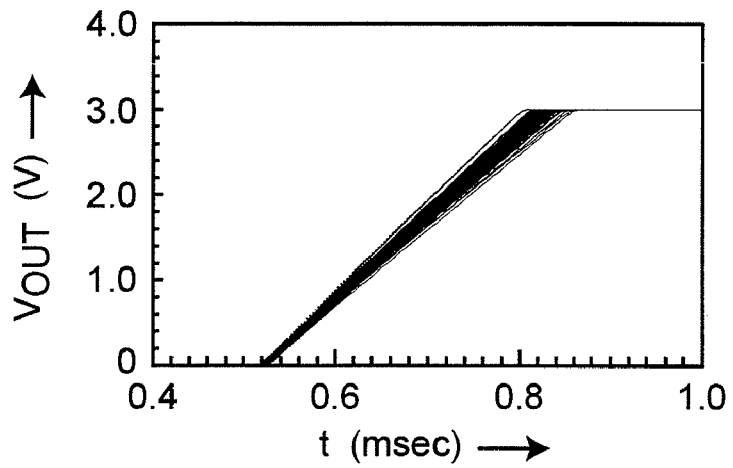
Figure 15C:
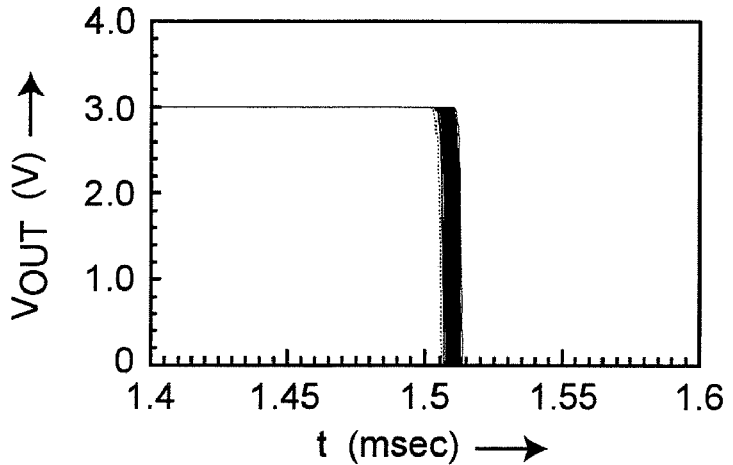

FIG. 15A is a graph showing simulation estimation results of the 2-stage comparator circuit of the first prior art of FIG. 2, or a waveform chart showing an output response waveform when the triangular wave signal is inputted. FIG. 15B is an enlarged illustration of a rising waveform of the output response waveform of FIG. 15A, and FIG. 15C is an enlarged illustration of a falling waveform of the output response waveform of FIG. 15A. In this case, the bias current is 10 nA, and, as apparent from FIGS. 15A, 15B and 15C, there is a response waveform of a slow rise time and a fast fall time due to the structural reason of the 2-stage comparator. The rise time has a very large delay time since the charging is performed with a minute current.

Figure 5:
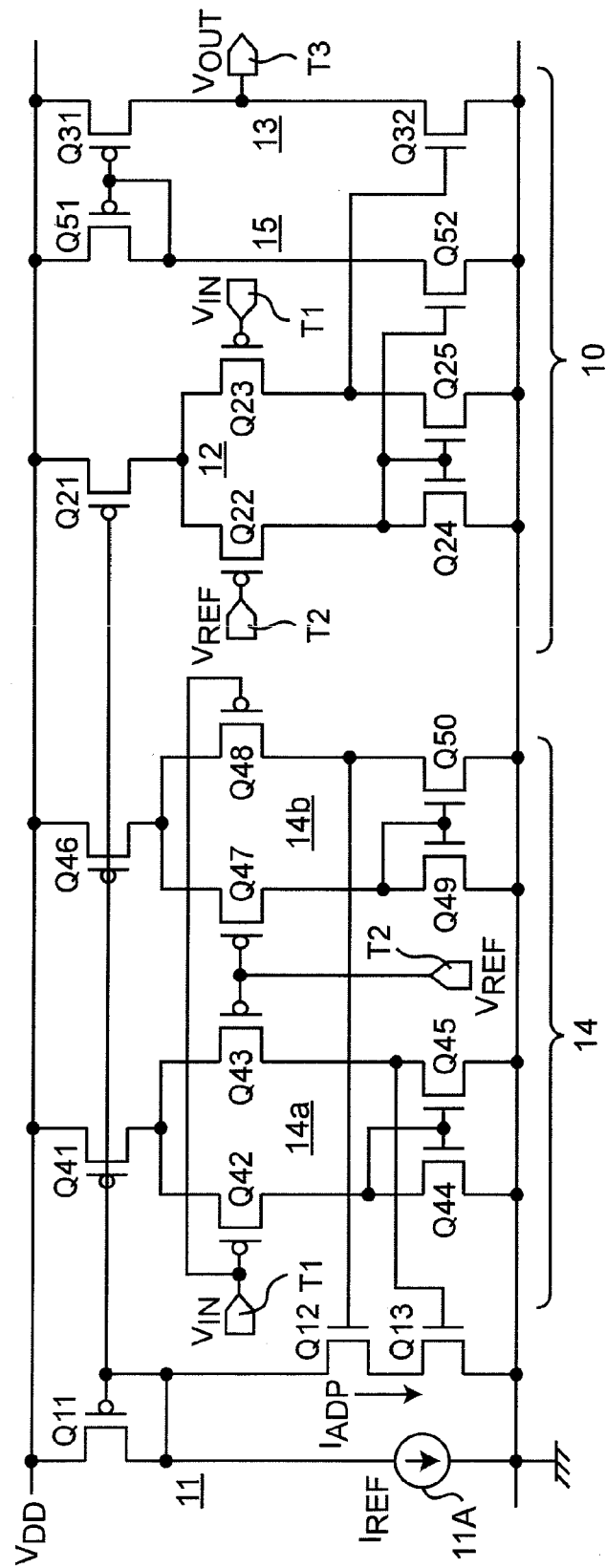
FIG. 5 is a circuit diagram showing a configuration of a comparator circuit according to a second prior art using an adaptive bias current control technique proposed by Nano Power Solution Inc.
Figure 6A:
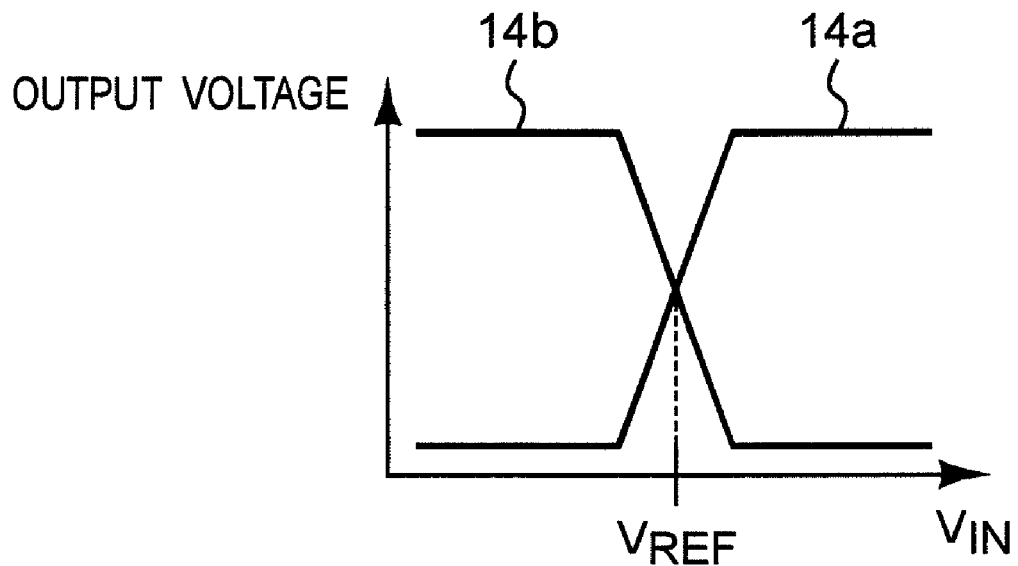
Figure 6B:
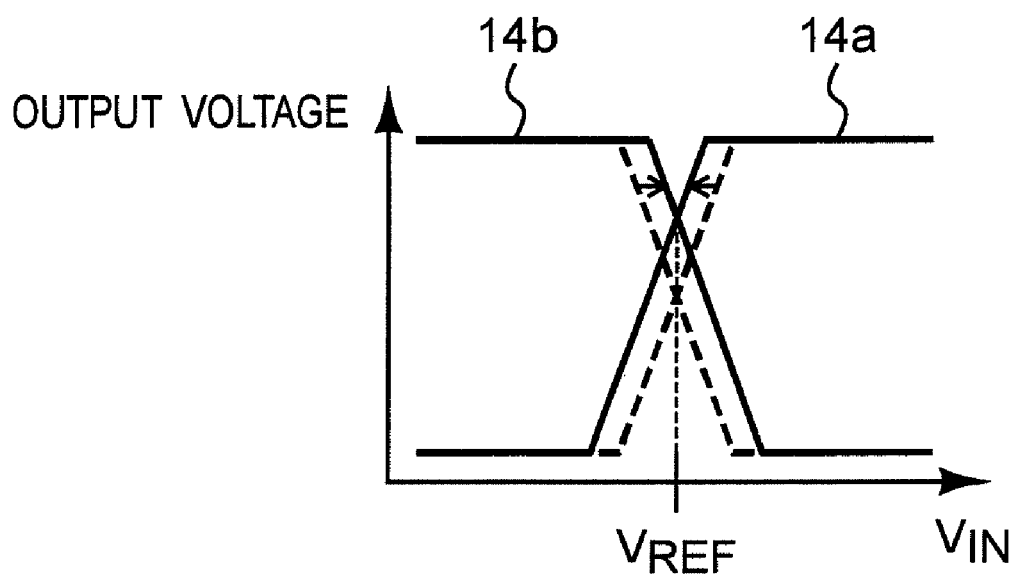
Figure 16A:
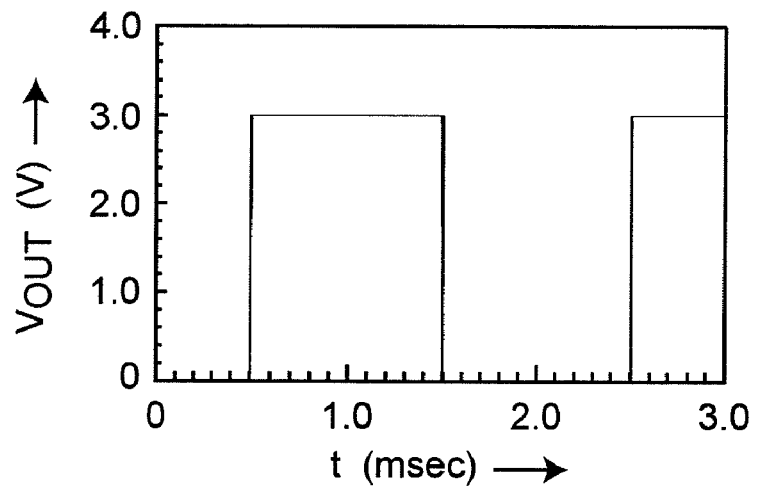
Figure 16B:
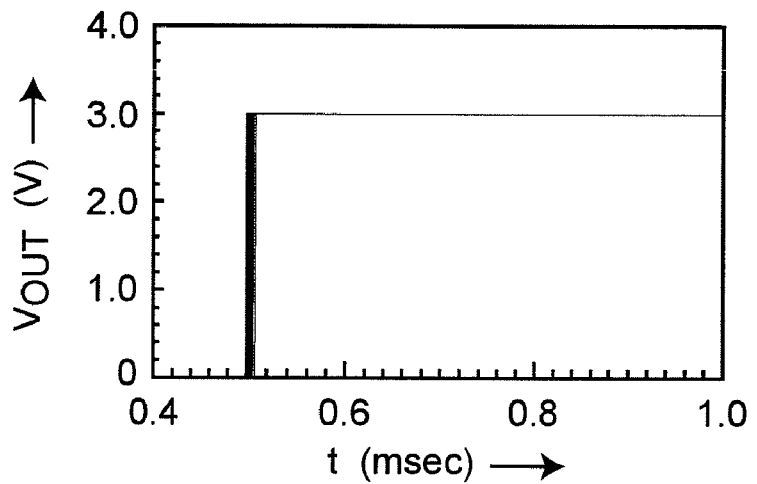
Figure 16C:
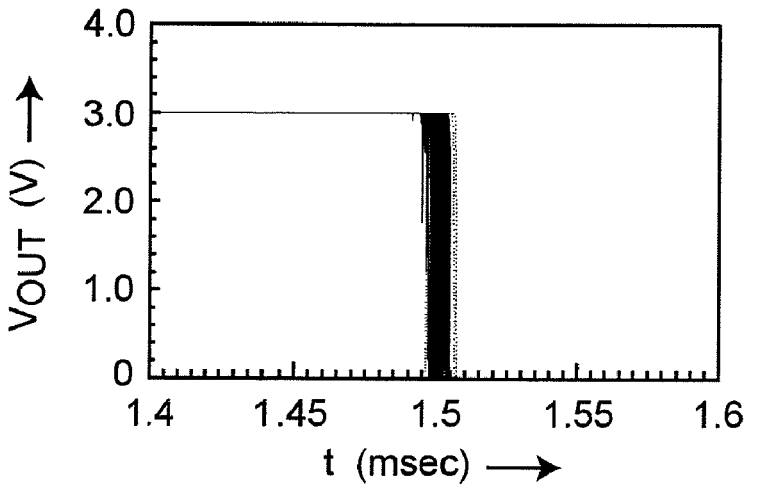

FIG. 16A is a graph showing simulation estimation results of the comparator circuit of the second prior art of FIG. 5, or a waveform chart showing an output response waveform when the triangular wave signal is inputted. FIG. 16B is an enlarged illustration of a rising waveform of the output response waveform of FIG. 16A, and FIG. 16C is an enlarged illustration of a falling waveform of the output response waveform of FIG. 16A. As apparent from FIGS. 16A, 16B and 16C, it could be confirmed that a steep output characteristic was achieved with respect to the triangular wave signal input.

Figure 17A:
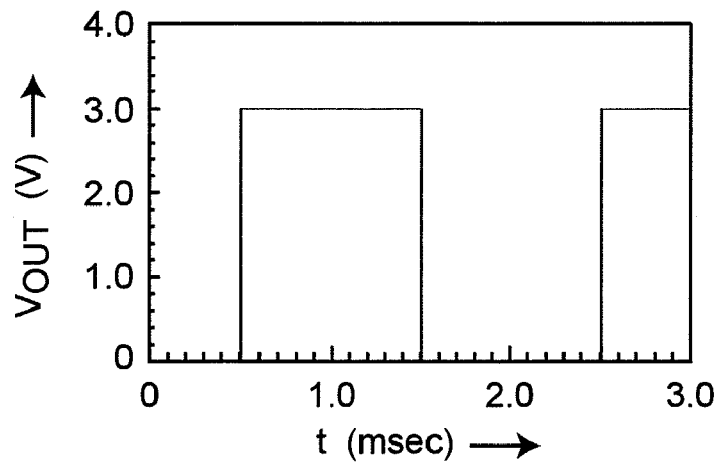
Figure 17B:
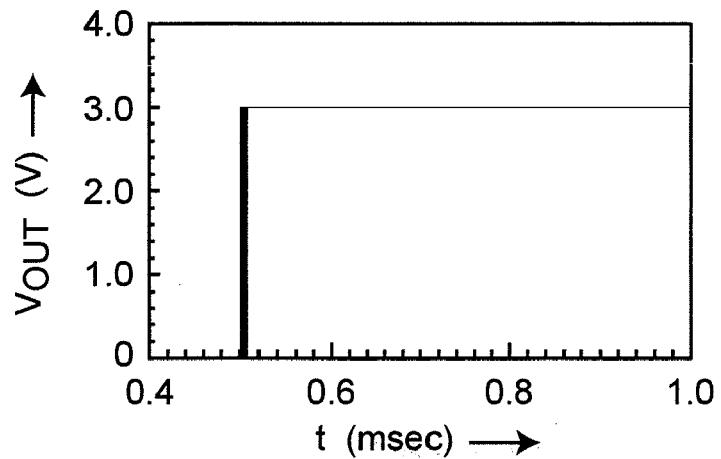
Figure 17C:
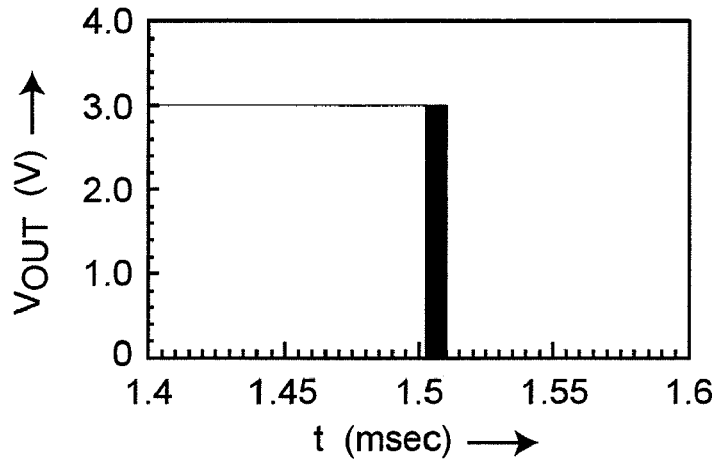

FIG. 17A is a graph showing simulation estimation results of the comparator circuit of the second preferred embodiment of FIG. 9A, or a waveform chart showing an output response waveform when the triangular wave signal is inputted. FIG. 17B is an enlarged illustration of a rising waveform of the output response waveform of FIG. 17A, and FIG. 17C is an enlarged illustration of a falling waveform of the output response waveform of FIG. 17A. As apparent from FIGS. 17A, 17B and 17C, a remarkable improvement in the rise time could be confirmed dissimilarly to the 2-stage comparator. Moreover, it was confirmed that a steep characteristic could be obtained also regarding the fall time.

Figure 18A:
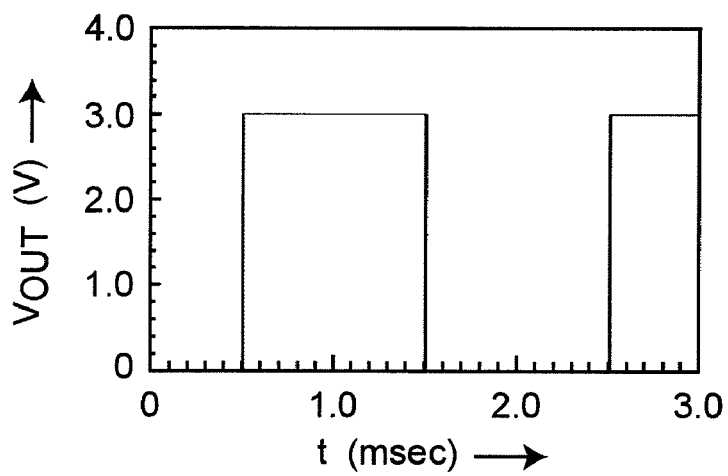
Figure 18B:
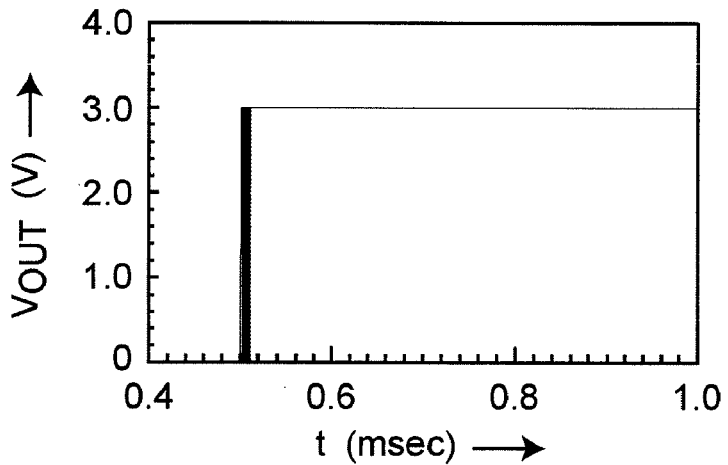
Figure 18C:
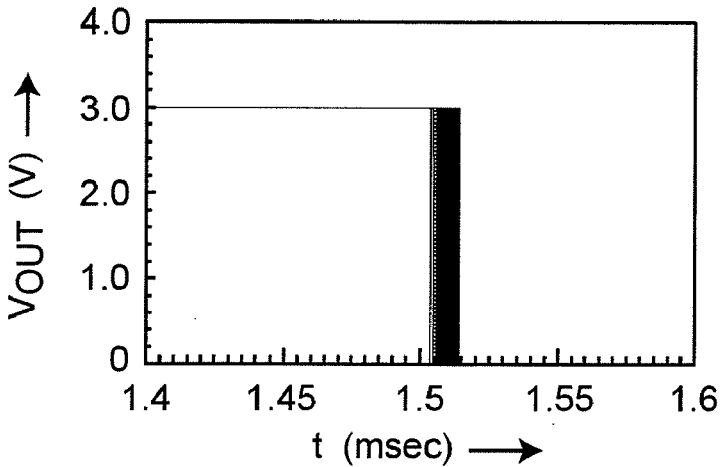

FIG. 18A is a graph showing simulation estimation results of the comparator circuit of the fourth preferred embodiment of FIG. 13, or a waveform chart showing an output response waveform when the triangular wave signal is inputted. FIG. 18B is an enlarged illustration of a rising waveform of the output response waveform of FIG. 18A, and FIG. 18C is an enlarged illustration of a falling waveform of the output response waveform of FIG. 18A. As apparent from FIGS. 18A, 18B and 18C, it is understandable that steep rise and fall characteristics similar to those of the results of FIG. 17 can be achieved.

Next, the response characteristic of the rectangular pulse signal input is described as follows. The estimation was made by setting the power supply voltage $V_{DD}$ to 3.0 V and the reference voltage $V_{REF}$ to 1.5 V as simulation conditions, and inputting two rectangular pulse signals (having a duty ratio of 50%) of 500 Hz as an input signal. Moreover, the bias current was set to $I_{REF}$=10 nA. It is assumed that the load capacitance, i.e., the capacitance connected to the output terminal T3 is 1 pF.

Figure 19A:
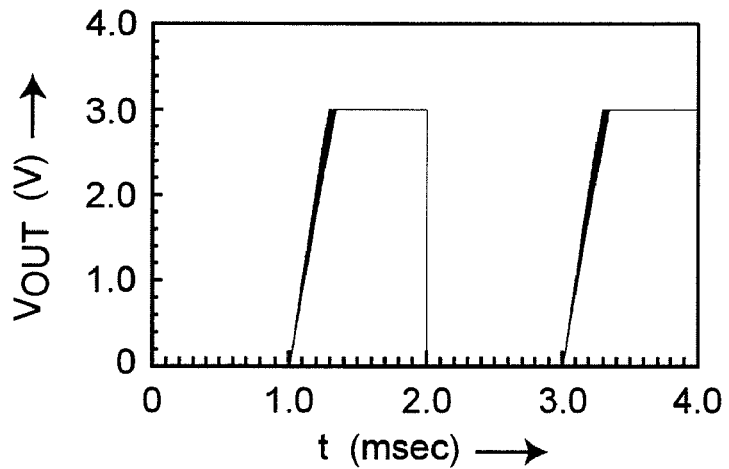
Figure 19B:
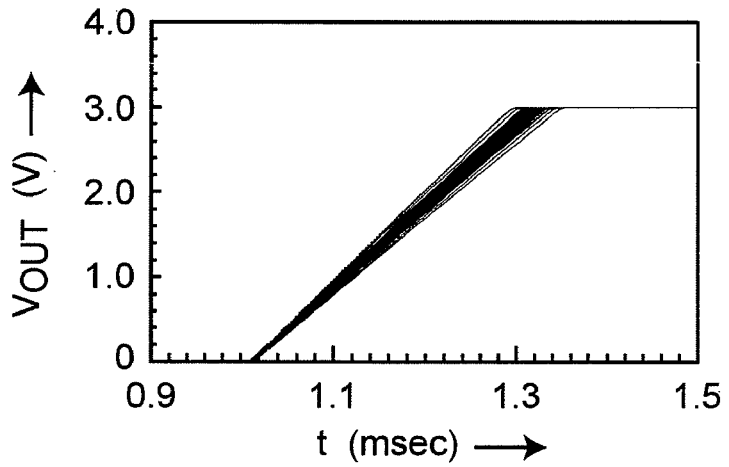
Figure 19C:
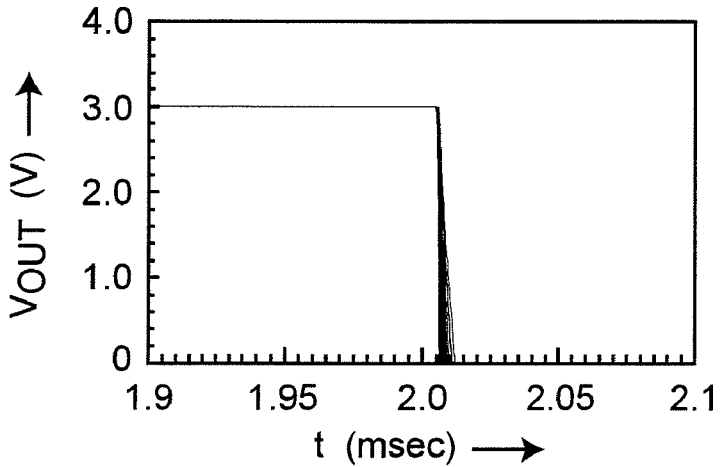

FIG. 19A is a graph showing simulation estimation results of the comparator circuit of the first prior art of FIG. 2, or a waveform chart showing an output response waveform when the rectangular pulse signal is inputted. FIG. 19B is an enlarged illustration of a rising waveform of the output response waveform of FIG. 19A, and FIG. 19C is an enlarged illustration of a falling waveform of the output response waveform of FIG. 19A. As apparent from FIG. 19, it could be confirmed that the rise time was very long in a manner similar to that of the case of input of the triangular wave signal.

Figure 20A:
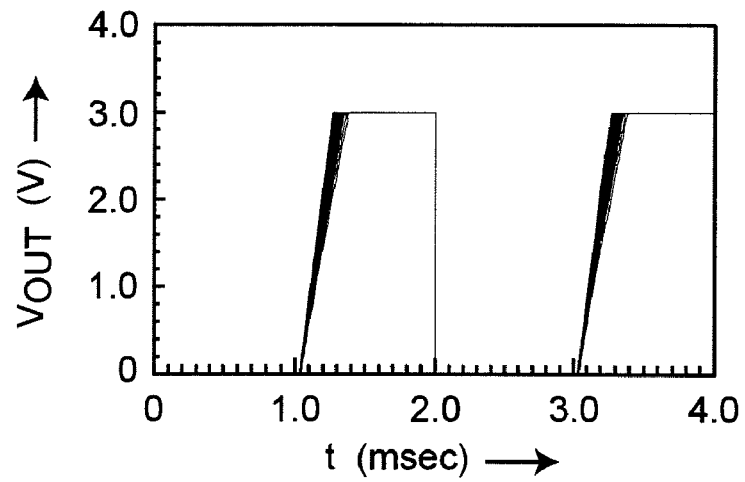
Figure 20B:
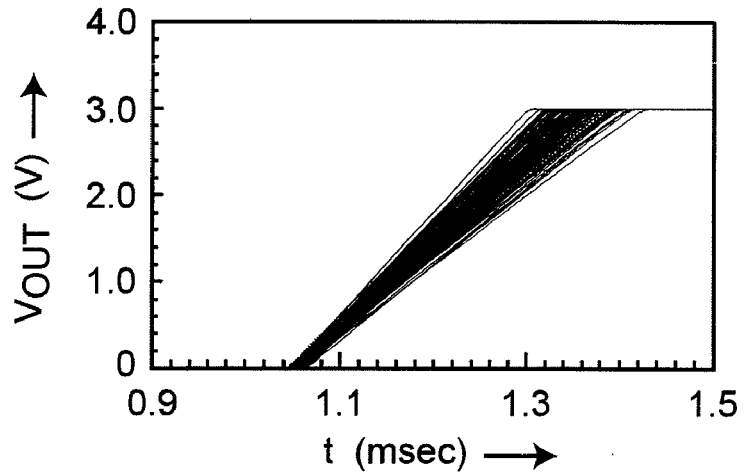
Figure 20C:
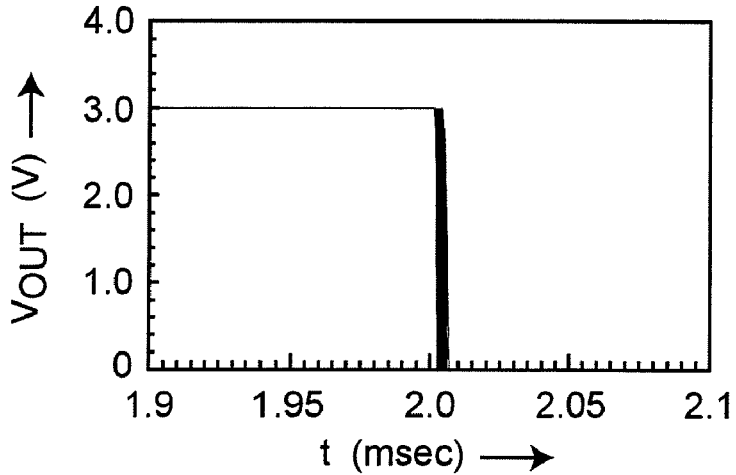

FIG. 20A is a graph showing simulation estimation results of the comparator circuit of the second prior art of FIG. 5, or a waveform chart showing an output response waveform when the rectangular pulse signal is inputted. FIG. 20B is an enlarged illustration of a rising waveform of the output response waveform of FIG. 20A, and FIG. 20C is an enlarged illustration of a falling waveform of the output response waveform of FIG. 20A. In contrast to the steep rising waveform achieved in the case of input of the triangular wave signal, it could be confirmed from the results of FIG. 20 that the rise had a gradual shape, which was equivalent to the performance of the 2-stage comparator circuit, and no improvement effect appeared. This is presumably ascribed to the fact that, because of the circuit designing performed with input of the triangular wave signal served as a criterion as described above, and the adaptive bias current control circuit could not generate a sufficient current for input of the steep pulse signal.

Figure 21A:
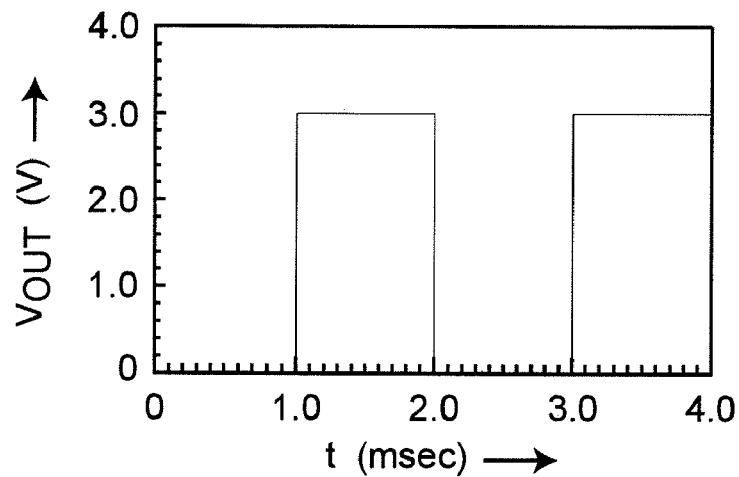
Figure 21B:
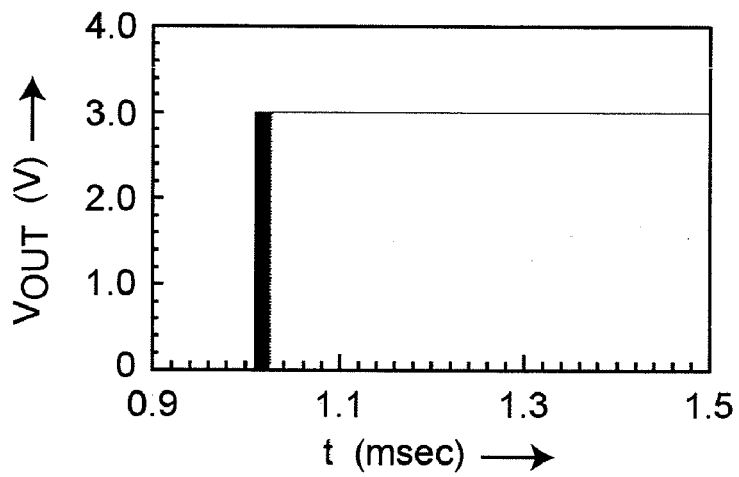
Figure 21C:
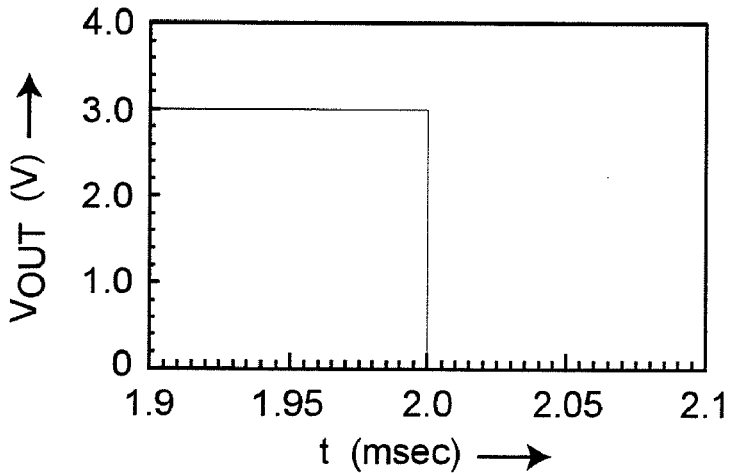

FIG. 21A is a graph showing simulation estimation results of the comparator circuit of the second preferred embodiment of FIG. 9A, or a waveform chart showing an output response waveform when the rectangular pulse signal is inputted. FIG. 21B is an enlarged illustration of a rising waveform of the output response waveform of FIG. 21A, and FIG. 21C is an enlarged illustration of a falling waveform of the output response waveform of FIG. 21A. As apparent from FIG. 21, it can be understood that the rise and fall times are remarkably improved. Moreover, it could be confirmed that the influence of the variation was reduced by comparison with the case of the triangular wave signal.

Figure 22A:
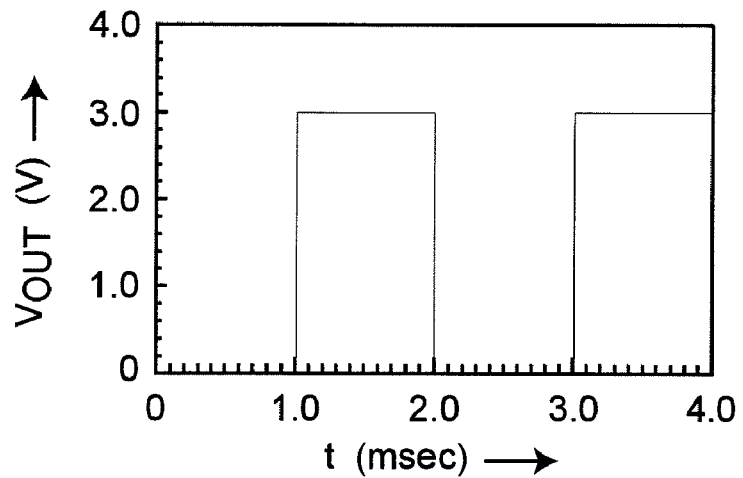
Figure 22B:
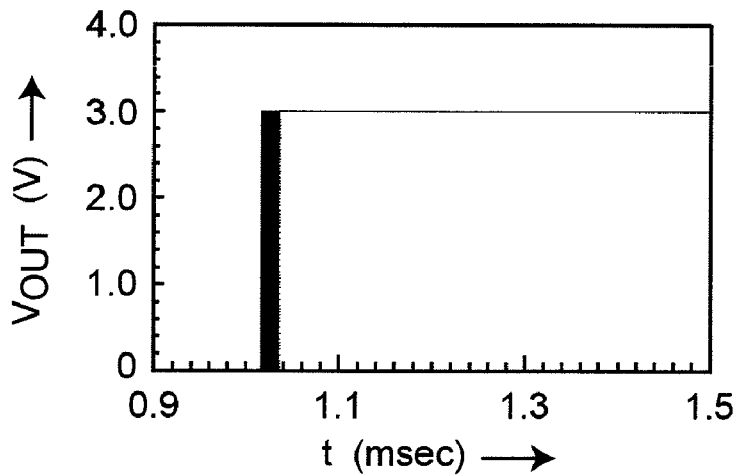
Figure 22C:
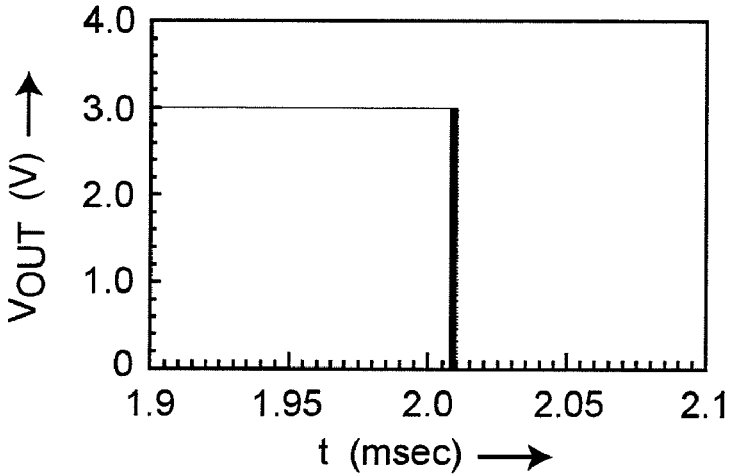

FIG. 22A is a graph showing simulation estimation results of the comparator circuit of the fourth preferred embodiment of FIG. 13, or a waveform chart showing an output response waveform when the rectangular pulse signal is inputted. FIG. 22B is an enlarged illustration of a rising waveform of the output response waveform of FIG. 22A, and FIG. 22C is an enlarged illustration of a falling waveform of the output response waveform of FIG. 22A. As apparent from FIG. 22, it can be understood that the rise and fall times are remarkably improved. Moreover, it could be confirmed that the influence of the variation was reduced by comparison with the case of the triangular wave signal.

Next, estimation of the delay time is described as follows.

FIG. 23 is a table showing circuit configurations and descriptions of the comparator circuits estimated in the present application, and FIG. 24 is a table showing estimation results of delay times in the circuit configurations of FIG. 23. In this case, the frequency of the triangular wave signal and the rectangular pulse signal of the input was set to 500 Hz.

Since the designing was performed with the case of input of the triangular wave signal served as a criterion, it could be confirmed that a sufficient delay characteristic was achieved in all the circuit configurations except for the 2-stage comparator circuit. On the other hand, a case where a pulse signal is inputted is considered. In each of the "NPS" and "BULK" comparator circuits that utilize two differential amplifiers 14a and 14b, the rise time is not remarkably improved. Since the circuit parameters were designed with the triangular wave signal served as a criterion, the high level at the time of input of the rectangular pulse signal could not sufficiently be secured, and an increase in the response time was caused. In contrast to this, it could be confirmed that remarkable improvements were achieved in all the circuits using the through current $I_{CS}$ of the CMOS inverter circuit.

First of all, the simulation results of the frequency characteristic are described as follows. In this case, the frequency characteristic at the time of input of the triangular wave signal was first estimated.

Figure 25:
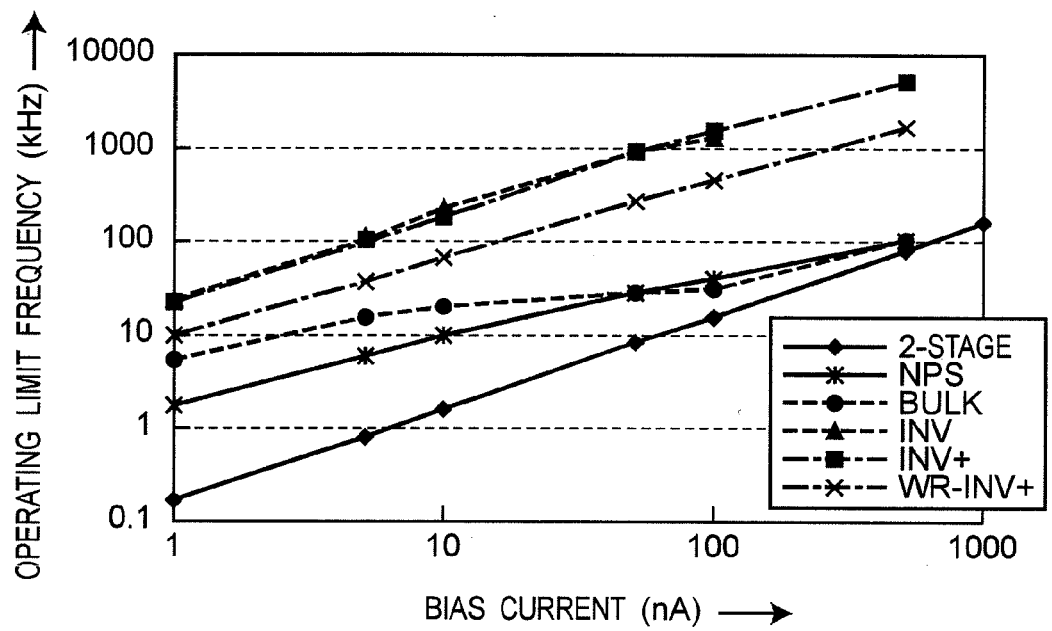
FIG. 25 is a graph showing relations between a bias current $I_{REF}$ and operating limit frequencies when the triangular wave signal is inputted in the circuit configurations of FIG. 23.

FIG. 25 is a graph showing relations between the bias current $I_{REF}$ and operating limit frequencies when the triangular wave signal is inputted in the circuit configurations of FIG. 23. As apparent from FIG. 25, it could be confirmed that the operating frequency rose when the bias current was increased according to all the results. This indicates an improvement in the driving force of the comparator circuit due to the rise in the bias current, which coincides with an intuitional consideration. The obtained results showed that the operating speed of the 2-stage comparator circuit was slowest, and the operating speed of the inverter-based comparator circuit was fastest.

Figure 26:
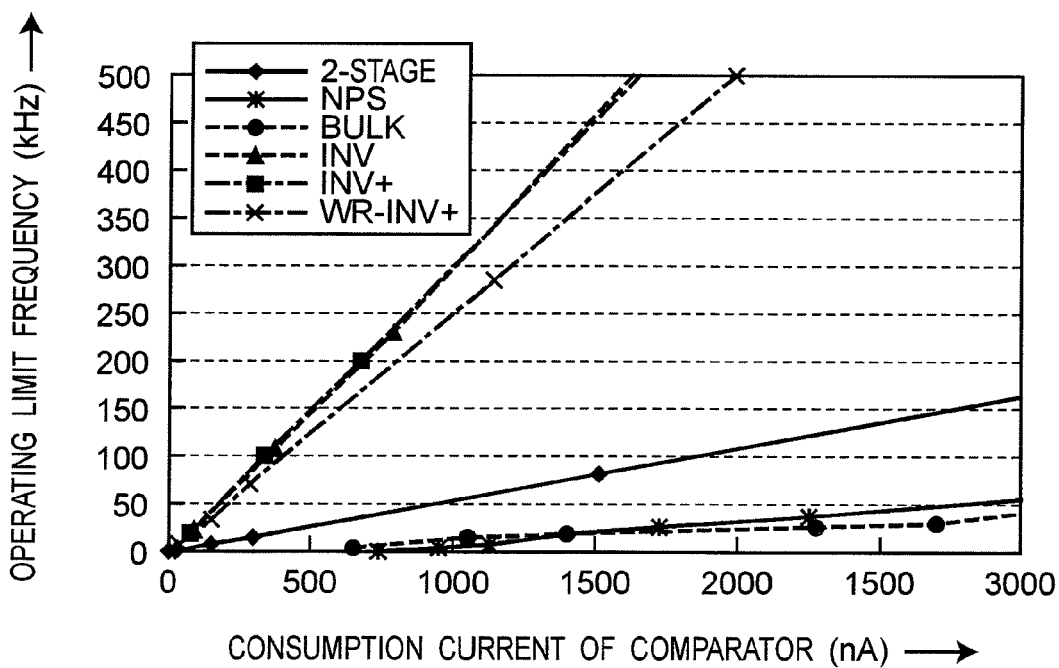
FIG. 26 is a graph showing relations between the consumption currents and the operating limit frequencies of the comparator circuits when a triangular wave signal is inputted in the circuit configurations of FIG. 23.

FIG. 26 is a graph showing relations between the consumption currents and the operating limit frequencies of the comparator circuits when the triangular wave signal is inputted in the circuit configurations of FIG. 23. The graph of FIG. 26 shows an operating limit frequency per current allowed by the comparator circuit. For example, it could be confirmed that the inverter-based comparator circuit had a high performance considering that a current consumption of only 500 nA is allowed by the comparator circuit. On the other hand, it could be confirmed that the NPS and bulk comparator circuits had performances deteriorated further than that of the 2-stage comparator circuit. This is ascribed to a reason that a large amount of current is disadvantageously consumed due to the influence of high level outputted from the adaptive bias current control circuit.

Figure 27:
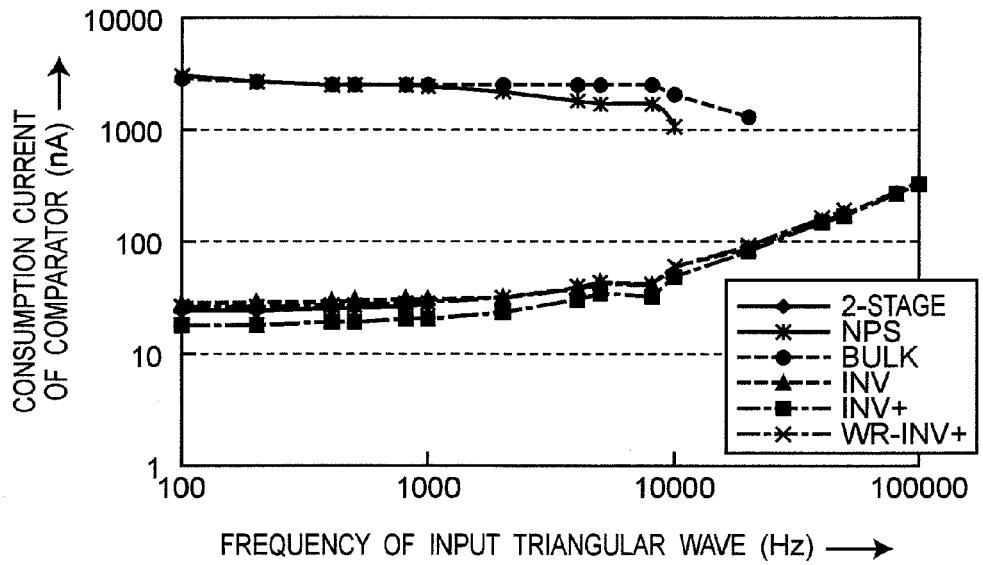
FIG. 27 is a graph showing relations between the input triangular wave signal frequency and the consumption currents of the comparator circuits when the triangular wave signal is inputted in the circuit configurations of FIG. 23.

FIG. 27 is a graph showing relations between the input triangular wave signal frequency and the consumption currents of the comparator circuits when the triangular wave signal is inputted in the circuit configurations of FIG. 23. In FIG. 27, the bias current was set to 10 nA. As apparent from FIG. 27, the adaptive bias control generates a large amount of current, and this causes a power increase in the NPS and bulk comparator circuits. Accordingly, there is high power consumption from the low frequency side to the high frequency. On the other hand, it could be confirmed that the inverter-based comparator circuit operated with a lower power at low frequencies, and the power rose in accordance with an increase in the frequency. The rise in the power indicates that the power consumption of the inverter circuit increase depending on the frequency. It is noted that the 2-stage comparator circuit becomes inoperative at about 1 kHz.

Next, the simulation results of input of the rectangular pulse signal are described as follows.

Figure 28:
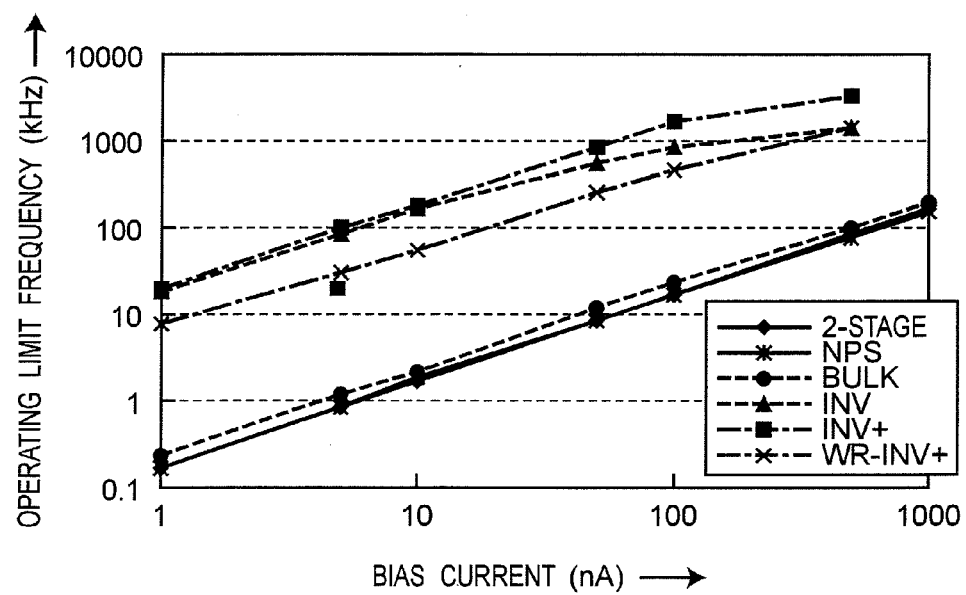
FIG. 28 is a graph showing relations between the bias current $I_{REF}$ and the operating limit frequencies when the triangular wave signal is inputted in the circuit configurations of FIG. 23.

FIG. 28 is a graph showing relations between the bias current $I_{REF}$ and the operating limit frequencies when the triangular wave signal is inputted in the circuit configurations of FIG. 23. As apparent from FIG. 28, a tendency almost similar to that in the case of input of the triangular wave signal could be confirmed. However, the performance is deteriorated regarding the NPS and bulk comparator circuits. This is because the input signal has a finite slope in the case of the triangular wave signal, and therefore, the operation of the adaptive bias current control circuit can follow it. However, in the case of input of the pulse signal, the adaptive bias current control circuit could not generate a sufficient current due to a steep signal change, and this resulted in the deterioration in the operating limit frequency.

Figure 29:
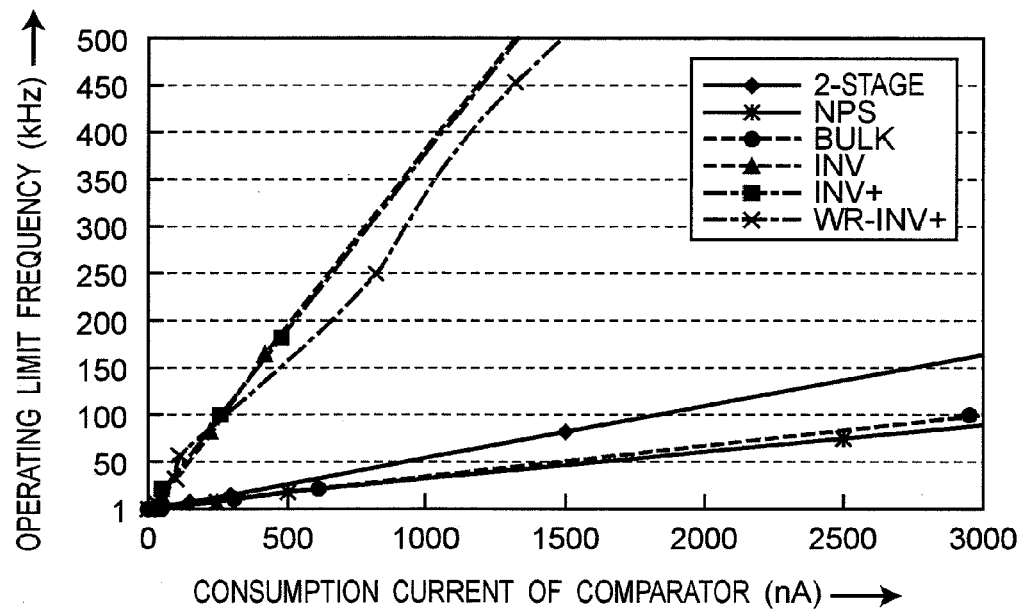
FIG. 29 is a graph showing relations between the consumption currents and the operating limit frequencies of the comparator circuits when the triangular wave signal is inputted in the circuit configurations of FIG. 23.

FIG. 29 is a graph showing relations between the consumption currents and the operating limit frequencies of the comparator circuits when the triangular wave signal is inputted in the circuit configurations of FIG. 23. As apparent from FIG. 29, a tendency similar to the case of the triangular wave signal could be confirmed. A slight improvement in the operating frequency is observed by comparison with the case of the triangular wave signal regarding the NPS and bulk comparator circuits. This is because a larger gate-source voltage can be secured in the case of the pulse signal due to the changeover of the input signal from the triangular wave signal to the pulse signal, and this is considered as part of the reason for the performance improvement.

Figure 30:
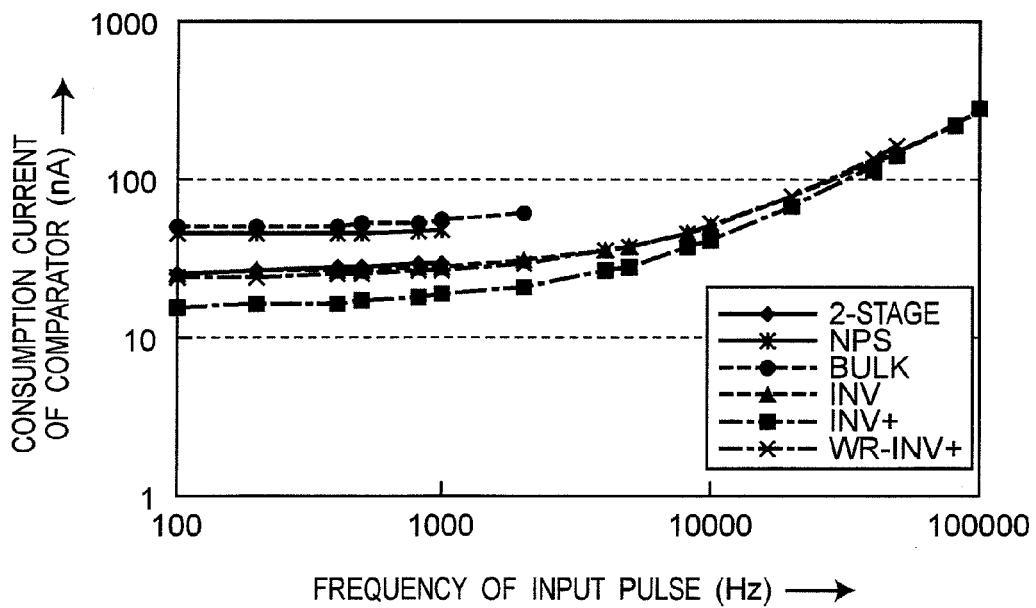
FIG. 30 is a graph showing relations between the input triangular wave signal frequency and the consumption currents of the comparator circuits when the triangular wave signal is inputted in the circuit configurations of FIG. 23.

FIG. 30 is a graph showing relations between the input triangular wave signal frequency and the consumption currents of the comparator circuits when the triangular wave signal is inputted in the circuit configurations of FIG. 23. In FIG. 30, the bias current was set to 10 nA. As apparent from FIG. 30, a reduction in the power of the NPS and bulk comparator circuits could be confirmed by comparison with input of the triangular wave signal. This is caused by the input waveform dependence of the adaptive bias current control circuit.

When the above estimation results are collected, the comparator circuits discussed this time can be categorized roughly into three groups.

(1) Standard comparator circuit (2-stage comparator circuit of the first prior art)

(2) The comparator circuit by the adaptive bias current control system using two differential amplifiers (comparator circuits of the second prior art and the first preferred embodiment)

(3) The comparator circuit by the adaptive bias current control system using a CMOS inverter (comparator circuits of the second to fourth preferred embodiments)

The comparator circuits of the three groups can be summarized as follows by comparison.

(1) A lower power can be achieved, but there is such a problem of a low operating frequency.

(2) The response to input of the pulse signal has little problems in terms of the configuration of the adaptive bias control system. However, there is a remaining problem in the response to the triangular wave signal. There is a possibility that the adaptive bias current control circuit generates a large current when a gradual waveform like the triangular wave signal is inputted. That is, a design conforming to the input waveform is necessary. Moreover, there is also such a problem that the circuit scale is large since two differential amplifiers are required for the adaptive bias current control circuit.

(3) The input waveform dependence is very small, and a very compact configuration can be achieved. The adaptive bias current control circuit of (2) generates the adaptive bias current by using two differential amplifiers. In contrast to this, the comparator circuit of (3), in which the one differential amplifier concurrently achieves the "adaptive bias current control function" and the "logical judgment function", has an advantage in the point that it functions as a compact lower-power comparator circuit.

It is noted that the meaning of the operation of the comparator circuit with the minute current is for power reduction. For the above purpose, the MOSFET of the comparator circuit is operated in the subthreshold region (meaning a region where the gate-source voltage of the MOSFET operates with a minute current below the threshold value (which changes depending on the manufacturing processes and is, for example, 0.5 V)) for a time interval when no logical judgment is made by making the bias current $I_{REF}$ of the current source 11A as a minute current.

As described in detail above, according to the comparator circuit of the invention, the adaptive bias current generator circuit generates and supplies an adaptive bias current for executing adaptive bias current control to the differential amplifier, based on the detected bias current and the detected through current, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier. The adaptive bias current is increased by utilizing the through current of the inverter circuit or increasing the output voltage of the differential amplifier with the substrate or body potential changed, and this allows to provide the comparator circuit, which is able to remarkably reduce the logical judgment time for the signal processing and to operate at higher speed than that of the prior art with achieving lower power consumption operation.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A comparator circuit having a differential amplifier, the comparator circuit making a logical judgment by comparing an input voltage with a reference voltage, generating and outputting an output voltage of a result of the logical judgment, the comparator circuit comprising:
    a current source, that generates and supplies bias current of a predetermined minute current to the differential amplifier;
    a first inverter circuit, that inverts a differential voltage from the differential amplifier and outputs an inverted signal; and
    an adaptive bias current generator circuit, that detects the bias current of the current source, and detects a through current of the first inverter circuit,
    wherein the adaptive bias current generator circuit generates and supplies an adaptive bias current for executing adaptive bias current control to the differential amplifier, based on the detected bias current and the detected through current, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier.

2. The comparator circuit as claimed in claim 1, wherein the adaptive bias current generator circuit separately detects the bias current of the current source and the through current of the first inverter circuit.

3. The comparator circuit as claimed in claim 1, wherein the adaptive bias current generator circuit detects the bias current of the current source, and generates the adaptive bias current by adding the detected bias current to the through current of the first inverter circuit.

4. The comparator circuit as claimed in claim 1, wherein the adaptive bias current generator circuit detects the through current of the first inverter circuit, and generates the adaptive bias current by adding the detected through current to the bias current of the current source.

5. The comparator circuit as claimed in claim 2, further comprising:
a second inverter circuit, which inverts an output voltage from the first inverter circuit and outputs a resulting voltage.

6. The comparator circuit as claimed in claim 3, further comprising:
a second inverter circuit, which inverts an output voltage from the first inverter circuit and outputs a resulting voltage.

7. The comparator circuit as claimed in claim 4, further comprising:
a second inverter circuit, which inverts an output voltage from the differential amplifier and outputs a resulting voltage.

8. The comparator circuit as claimed in claim 1, wherein the differential amplifier is a wide-range differential amplifier that makes a full swing from a ground potential to a power supply voltage.

9. The comparator circuit as claimed in claim 2, wherein the differential amplifier is a wide-range differential amplifier that makes a full swing from a ground potential to a power supply voltage.

10. The comparator circuit as claimed in claim 3, wherein the differential amplifier is a wide-range differential amplifier that makes a full swing from a ground potential to a power supply voltage.

11. The comparator circuit as claimed in claim 4, wherein the differential amplifier is a wide-range differential amplifier that makes a full swing from a ground potential to a power supply voltage.

12. The comparator circuit as claimed in claim 8, wherein a diode-connection transistor is inserted in a power supply circuit of the wide-range differential amplifier.

13. The comparator circuit as claimed in claim 9, wherein a diode-connection transistor is inserted in a power supply circuit of the wide-range differential amplifier.

14. The comparator circuit as claimed in claim 10, wherein a diode-connection transistor is inserted in a power supply circuit of the wide-range differential amplifier.

15. The comparator circuit as claimed in claim 11, wherein a diode-connection transistor is inserted in a power supply circuit of the wide-range differential amplifier.

16. A comparator circuit formed on a substrate, the comparator comprising:
a first differential amplifier that makes a logical judgment by comparing an input voltage with a reference voltage, generates and outputting an output voltage of a result of the logical judgment; and
a current source, which generates and supplies a bias current of a predetermined minute current to the differential amplifier, and
an adaptive bias current generator circuit including a second differential amplifier that generates an output voltage by comparing an input voltage with a reference voltage,
wherein the adaptive bias current generator circuit generates and supplies an adaptive bias current for executing adaptive bias current control to the differential amplifier, based on the input voltage and the reference voltage, so as to allow the differential amplifier to operate with the bias current for a time interval of no logical judgment executed by the differential amplifier, and to allow the differential amplifier to operate by using the adaptive bias current obtained by increasing the bias current for a time interval of logical judgment executed by the differential amplifier,
wherein the second differential amplifier comprises:
a first differential pair including a first transistor to which the input voltage is inputted and a second transistor to which the reference voltage is inputted; and
a second differential pair including a third transistor to which the input voltage is inputted and a fourth transistor to which the reference voltage is inputted, and
wherein an output voltage of the second differential amplifier at a voltage where input-to-voltage characteristics of the two differential pairs intersect with each other is increased by connecting source electrodes of the first transistor and the fourth transistor to the substrate, and connecting substrates of the second transistor and the third transistor to a predetermined bias voltage.

17. The comparator circuit as claimed in claim 16, wherein the bias voltage is a power supply voltage.

* * * * *